(12) United States Patent
Chidurala et al.

(10) Patent No.: US 11,588,448 B2
(45) Date of Patent: Feb. 21, 2023

(54) RADIO FREQUENCY TRANSISTOR AMPLIFIERS HAVING LEADFRAMES WITH INTEGRATED SHUNT INDUCTORS AND/OR DIRECT CURRENT VOLTAGE SOURCE INPUTS

(71) Applicant: Wolfspeed, Inc., Durham, NC (US)

(72) Inventors: Madhu Chidurala, Los Altos, CA (US); Richard Wilson, Morgan Hill, CA (US); Haedong Jang, San Jose, CA (US); Simon Ward, Morgan Hill, CA (US)

(73) Assignee: Wolfspeed, Inc., Durham, NC (US)

( * ) Notice: Subject to any disclaimer, the term of this patent is extended or adjusted under 35 U.S.C. 154(b) by 118 days.

(21) Appl. No.: 16/910,900

(22) Filed: Jun. 24, 2020

(65) Prior Publication Data
US 2021/0408978 A1    Dec. 30, 2021

(51) Int. Cl.
| | | |
|---|---|---|
| H03F 3/195 | (2006.01) | |
| H01L 23/047 | (2006.01) | |
| H01L 23/367 | (2006.01) | |
| H01L 23/66 | (2006.01) | |
| H01L 23/00 | (2006.01) | |
| H01L 25/16 | (2006.01) | |
| H03F 1/56 | (2006.01) | |

(52) U.S. Cl.
CPC ........... H03F 3/195 (2013.01); H01L 23/047 (2013.01); H01L 23/367 (2013.01); H01L 23/66 (2013.01); H01L 24/48 (2013.01); H01L 25/165 (2013.01); H03F 1/56 (2013.01); H01L 2223/6655 (2013.01); H01L 2224/48137 (2013.01); H01L 2224/48175 (2013.01); H01L 2924/1033 (2013.01); H01L 2924/10253 (2013.01); H01L 2924/10346 (2013.01); H01L 2924/1205 (2013.01); H01L 2924/13064 (2013.01); H01L 2924/13091 (2013.01); H01L 2924/1421 (2013.01); H01L 2924/30111 (2013.01); H03F 2200/387 (2013.01); H03F 2200/451 (2013.01)

(58) Field of Classification Search
CPC ............ H01L 23/66; H01L 2223/6655; H01L 2223/6661; H01L 2924/1421; H03F 3/195; H03F 2200/387; H03F 2200/451
See application file for complete search history.

(56) References Cited

U.S. PATENT DOCUMENTS

| | | | |
|---|---|---|---|
| 9,349,693 B2 * | 5/2016 | Lakshminarayan | .... H03F 3/195 |
| 10,438,908 B2 * | 10/2019 | Roiz | ........................ H01L 24/49 |
| 10,629,518 B2 * | 4/2020 | Sanchez | ................ H01L 21/565 |

(Continued)

*Primary Examiner* — David A Zarneke
(74) *Attorney, Agent, or Firm* — Myers Bigel, P.A.

(57) ABSTRACT

A packaged radio frequency transistor amplifier includes a package housing, an RF transistor amplifier die that is mounted within the package housing, a first capacitor die that is mounted within the package housing, an input leadframe that extends through the package housing to electrically connect to a gate terminal of the RF transistor amplifier die, and an output leadframe that extends through the package housing to electrically connect to a drain terminal of the RF transistor amplifier die. The output leadframe includes an output pad region, an output lead that extends outside of the package housing, and a first arm that extends from one of the output pad region and the output lead to be adjacent the first capacitor die.

30 Claims, 14 Drawing Sheets

(56) References Cited

U.S. PATENT DOCUMENTS

| | | |
|---|---|---|
| 2021/0152130 A1* | 5/2021 | Srinidhi Embar .... H03F 1/0288 |
| 2021/0202408 A1* | 7/2021 | Khalil ....................... H03F 3/21 |
| 2021/0203278 A1* | 7/2021 | Wei ......................... H01L 23/66 |
| 2021/0225784 A1* | 7/2021 | Shilimkar ............. H01L 23/552 |

* cited by examiner

US 11,588,448 B2

RADIO FREQUENCY TRANSISTOR AMPLIFIERS HAVING LEADFRAMES WITH INTEGRATED SHUNT INDUCTORS AND/OR DIRECT CURRENT VOLTAGE SOURCE INPUTS

FIELD

The present invention relates to microelectronic devices and, more particularly, to radio frequency ("RF") transistor amplifiers.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now high demand for RF transistor amplifiers that are used to amplify RF signals at frequencies of, for example, 500 MHz and higher (including microwave frequencies) for cellular telephone, radar and other applications. These RF transistor amplifiers often need to exhibit high reliability, good linearity and handle high output power levels.

Most RF transistor amplifiers are implemented in silicon or wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier die are used, they may be connected in series and/or in parallel.

RF transistor amplifiers often include matching circuits, such as (1) impedance matching circuits that are designed to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics. The RF transistor amplifier die(s) as well as the impedance matching and harmonic termination circuits may be enclosed in a package. Electrical leads may extend from the package that are used to electrically connect the RF transistor amplifier to external circuit elements such as input and output RF transmission lines and bias voltage sources.

As noted above, Group III nitride-based RF transistor amplifiers are often used in high power and/or high frequency applications. Typically, high levels of heat are generated within a Group III nitride-based RF transistor amplifier die during operation. If the RF transistor amplifier die becomes too hot, its performance (e.g., output power, efficiency, linearity, gain, etc.) may deteriorate and/or the RF transistor amplifier die may be damaged. As such, Group III nitride-based RF transistor amplifiers are typically mounted in packages that may be optimized for heat removal.

FIGS. 1A through 1D schematically illustrate a conventional packaged RF transistor amplifier 1. In particular, FIG. 1A is a schematic top view of the packaged RF transistor amplifier 1 with the walls and lid of the package omitted to show the circuit elements forming the RF transistor amplifier. FIG. 1B is a cross-sectional view of the complete packaged RF transistor amplifier 1 (i.e., the walls and lid are included in FIG. 1B). The cross-section of FIG. 1B is taken along line 1B-1B of FIG. 1A. FIG. 1C is a schematic plan view of an RF transistor amplifier die that is included in the packaged RF transistor amplifier 1 of FIGS. 1A-1B. Finally, FIG. 1D is an equivalent circuit diagram of the RF transistor amplifier 1.

As shown in FIGS. 1A-1B, the RF transistor amplifier 1 comprises a package 10 and a plurality of circuit components that are mounted within the package 10. The package 10 includes a submount 12, walls 14, a lid 16, an input leadframe 20 and an output leadframe 30. The submount 12 may comprise, for example, a metal block. The submount 12 may provide an electrical connection to ground, and may also serve as a heat dissipation structure that dissipates heat that is generated in an RF transistor amplifier die that is mounted within the package 10. The submount 12, walls 14 and lid 16 form a package housing 18. The input leadframe 20 and the output leadframe 30 extend through respective walls of the package housing 18. The walls 14 and lid 16 may be formed of a ceramic material. The submount 12, walls 14 and lid 16 may define a cavity, so that package 10 is often referred to as an open cavity package. The input leadframe 20 may comprise an input pad 22 that is within the package housing 18 and an input lead 24 that extends from the input pad 22 through a front wall 14-1 of the package housing 18. The output leadframe 30 may comprise an output pad 32 that is within the package housing 18 and an output lead 34 that extends from the output pad 32 through a rear wall 14-2 of the package housing 18.

The circuit components that are mounted within the package 10 include an RF transistor amplifier die 40, an input impedance matching capacitor die 54, an input harmonic termination capacitor die 64, and an output impedance matching capacitor die 74. The three capacitor die 54, 64, 74 are part of an input impedance matching circuit 50, an input harmonic termination circuit 60, and an output impedance matching circuit 70, respectively. The die 40, 54, 64, 74 are mounted on the submount 12. Each die 40, 54, 64, 74 may have a terminal on its bottom side that is electrically connected to the submount 12 by, for example, a conductive die attach material (not shown). The RF transistor amplifier die 40 includes a gate terminal 42 which acts as the RF input to the RF transistor amplifier die 40 and a drain terminal 44 that acts as an RF output for the RF transistor amplifier die 40. The RF transistor amplifier die 40 further includes a source terminal 46 (FIG. 1B) that is on the bottom side of the die 40. FIG. 1C is a plan view of the RF transistor amplifier die 40 illustrating the gate terminal 42 and the drain terminal 44, each of which may be implemented as metal pads on a top surface of the RF transistor amplifier die 40. A protective insulating layer or pattern 48 may cover the rest of the top surface of the RF transistor amplifier die 40.

As shown in FIGS. 1A-1B, the input impedance matching circuit 50 includes a set of first bond wires 52, the input impedance matching capacitor die 54 and a set of second bond wires 56. Proximate ends of the first bond wires 52 are coupled to the input pad 22 of input leadframe 20 and distal ends of the first bond wires 52 are coupled to the first electrode of a capacitor (or a set of capacitors) included in the input impedance matching capacitor die 54. The second electrode of the capacitor included in the input impedance matching capacitor die 54 is mounted on the bottom side of the input impedance matching capacitor die 54 so that it is electrically connected to the submount 12. The submount 12 may be electrically coupled to electrical ground. The second bond wires 56 extend between the first electrode of the capacitor included in the input impedance matching capacitor die 54 and the gate terminal 42 of RF transistor amplifier die 40. The second bond wires 56 pass over the harmonic termination capacitor die 64.

The harmonic termination circuit 60 includes a set of third bond wires 62 and the harmonic termination capacitor die 64. The third bond wires 62 are coupled between the gate terminal 42 of RF transistor amplifier die 40 and a first electrode of the capacitor (or set of capacitors) included in the harmonic termination capacitor die 64. The second electrode of the capacitor included in the first harmonic termination die 64 is mounted on the bottom side of the harmonic termination capacitor die 64 to be electrically connected to the submount 12 (which, again, provides an electrical connection to ground).

A set of fourth bond wires 46 extend between the drain terminal 44 of RF amplifier die 40 and the output pad 32 of the output leadframe 30. The fourth bond wires 66 pass over the output impedance matching capacitor die 74.

The output impedance matching circuit 70 comprises a set of fifth bond wires 72 and the output impedance matching capacitor die 74. Distal ends of the fifth bond wires 72 are coupled to the output pad 32 of the output leadframe 30, and proximate ends of the fifth bond wires are coupled to the first electrode of a capacitor (or a set of capacitors) included in the output impedance matching capacitor die 74. The second electrode of the capacitor included in the output impedance matching capacitor die 74 is mounted on the bottom side of the output impedance matching capacitor die 74 to be electrically connected to the submount 12 (which, again, provides an electrical connection to ground).

FIG. 1D is an equivalent circuit diagram of the RF transistor amplifier 1. As shown in FIG. 1D, RF signals that are to be amplified may be input to RF transistor amplifier 1 through the input lead 20. The set of first bond wires 52 acts as a series inductance L1 between the input lead 20 and a node N1, which is the first electrode of the input impedance matching capacitor die 54. The second electrode of the input impedance matching capacitor die 54 is coupled to ground through submount 12 to form a shunt capacitance C1. The set of second bond wires 56 acts as a series inductance L2 between node N1 and the gate terminal 42 of the RF transistor amplifier die 40. The set of third bond wires 62 acts as an inductance L3 and the harmonic termination capacitor die 64 forms a capacitance C2. The inductance L3 and the capacitance C2 are coupled are coupled in series between gate terminal 42 of the RF transistor amplifier die 40 and electrical ground, forming the shunt input harmonic termination circuit 60.

The drain terminal 44 of RF transistor amplifier die 40 is connected by the set of fourth bond wires 46 to the output pad 32 of the output leadframe 30. The fourth set of bond wires 46 thus acts as a series inductance L4. The amplified RF signals output at the drain terminal 44 are output from RF transistor amplifier 1 through the output lead 34 of output leadframe 30. The set of fifth bond wires 72 acts as an inductance L5 and the output impedance matching capacitor die 74 forms a capacitance C3. The inductance L5 and the capacitance C3 are coupled in series between the output leadframe 30 and electrical ground, forming the shunt output impedance matching circuit 70.

FIGS. 1A-1B illustrate a so-called open-cavity packaged RF transistor amplifier. FIG. 1E is a schematic cross-sectional view of a conventional packaged RF transistor amplifier 1A that replaces the ceramic walls 14 and lid 16 of RF transistor amplifier 1 with a plastic overmold package 10A that includes a submount 12, a plastic overmold 18A.

SUMMARY

Pursuant to embodiments of the present invention, packaged RF transistor amplifiers are provided that include a package housing, an RF transistor amplifier die that is mounted within the package housing, a first capacitor die that is mounted within the package housing, an input leadframe that extends through the package housing to electrically connect to a gate terminal of the RF transistor amplifier die, and an output leadframe that extends through the package housing to electrically connect to a drain terminal of the RF transistor amplifier die, the output leadframe including an output pad region, an output lead that extends outside of the package housing, and a first arm that extends from one of the output pad region and the output lead to be adjacent the first capacitor die.

In some embodiments, the first capacitor die may be a first output impedance matching capacitor die, and where the first arm may be part of an electrical path connecting a drain terminal of the RF transistor amplifier die to the first output impedance matching capacitor die.

In some embodiments, a width of the first arm may be less than half a width of the output pad region.

In some embodiments, the first arm may have an L-shape.

In some embodiments, the output leadframe further may comprise a second arm that extends from one of the output pad region and the output lead to be adjacent a second output impedance matching capacitor die. In some of these embodiments, the first arm may have an L-shape and the second arm may have an L-shape.

In some embodiments, a longitudinal axis of the output lead may extend in a first direction, and where the first arm may extend in a second direction that is substantially perpendicular to the first direction.

In some embodiments, a distal end of the first arm may be outside the package housing. The distal end of the first arm may be configured to be connected to a direct current voltage source.

In some embodiments, the output lead may extend through a first wall of the package housing, and the first arm may extend through a second wall of the package housing that is different from the first wall. In some embodiments, the second wall may be generally opposite the first wall. In other embodiments, the second wall may be generally perpendicular to the first wall.

In some embodiments, the output lead and the first arm may both extend through a first wall of the package housing.

In some embodiments, the input leadframe may include an input pad region, an input lead, and a third arm that extends from the input pad region to outside the package housing to provide a direct current voltage source input. In some embodiments, the input lead may extend through a first wall of the package housing, and the first arm may extend through a second wall of the package housing that is different from the first wall. In some embodiments, the second wall may be generally perpendicular to the first wall.

In some embodiments, the input lead may extend through a first wall of the package housing, and the third arm may extend through the first wall of the package housing.

In some embodiments, the input leadframe further comprises a fourth arm that extends from the input pad region.

In some embodiments, the packaged RF transistor amplifier may further include a second capacitor die, where a portion of the third arm may be adjacent the second capacitor die.

In some embodiments, the packaged RF transistor amplifier may further include a first set of bond wires that physically and electrically connect the first output impedance matching capacitor die to the first arm.

In some embodiments, the packaged RF transistor amplifier may further include a second set of bond wires that physically and electrically connect the drain terminal of the RF transistor amplifier die to the output pad region of the output leadframe.

In some embodiments, the first output impedance matching capacitor die may be connected to the first arm by a first conductive bump.

In some embodiments, the output pad region of the output leadframe may be connected to the drain terminal of the RF transistor amplifier die by a second conductive bump.

In some embodiments, the packaged RF transistor amplifier may further include a second set of bond wires that physically and electrically connect the drain terminal of the RF transistor amplifier die to the output pad region of the output leadframe.

In some embodiments, the RF transistor amplifier die may be configured to operate in at least a portion of one or more of the 2.5-2.7 GHz, 3.4-4.2 GHz, or 5.1-5.8 GHz frequency bands.

In some embodiments, the RF transistor amplifier die may be configured to operate at frequencies above 10 GHz.

In some embodiments, the RF transistor amplifier die is a first RF transistor amplifier die and the output leadframe is a first output leadframe, the packaged RF transistor amplifier further comprising a second RF transistor amplifier die that is mounted within the package housing, a second capacitor die that is mounted within the package housing, and a second output leadframe that extends through the package housing to electrically connect to a drain terminal of the second RF transistor amplifier die, the second output leadframe including a second arm that extends to be adjacent the second capacitor die.

In some embodiments, the package housing may comprise a submount and a plastic overmold, and the RF transistor amplifier die and the capacitor die may be mounted on a top surface of the submount and the plastic overmold may cover the top surface of the submount, the RF transistor amplifier die and the capacitor die.

In some embodiments, the package housing may comprise a submount, walls mounted on a top surface of the submount, and a lid mounted on the walls, and the RF transistor amplifier die and the capacitor die may be mounted on the top surface of the submount within an open cavity defined by the top surface of the submount, the walls and the lid.

Pursuant to further embodiments of the present invention, packaged RF transistor amplifiers are provided that include a package housing, an RF transistor amplifier die that is mounted within the package housing, an input leadframe that includes an input lead that extends through the package housing to electrically connect to a gate terminal of the RF transistor amplifier die, and a monolithic output leadframe that includes an output lead, a direct current lead and an electrical connection between the output lead and the direct current lead. The output lead extends through a first portion of the package housing to electrically connect to a drain terminal of the RF transistor amplifier die, and the direct current lead extends through a second portion of the package housing that is spaced apart from the first portion of the package housing.

In some embodiments, the electrical connection between the output lead and the direct current lead may be within the package housing.

In some embodiments, the output leadframe further may include an output pad region, and wherein the direct current lead comprises an arm that extends from the output pad region.

In some embodiments, the packaged RF transistor amplifier may further include a first capacitor die, where a portion of the first arm is adjacent the first capacitor die. In some embodiments, the first capacitor die may be a first output impedance matching capacitor die, and the first arm may be part of an electrical path connecting a drain terminal of the RF transistor amplifier die to the first output impedance matching capacitor die.

In some embodiments, the packaged RF transistor amplifier may further include a second output impedance matching capacitor die, where the output leadframe further comprise a second arm that extends from the output pad region so that a portion of the second arm is adjacent the second output impedance matching capacitor die.

In some embodiments, the output lead may extend through a first wall of the package housing, and the direct current lead may extend through a second wall of the package housing. In some embodiments, the second wall may be generally opposite the first wall. In other embodiments, the second wall may be generally perpendicular to the first wall.

In some embodiments, the input leadframe may be a monolithic input leadframe that includes the input lead a second direct current lead and an electrical connection between the input lead and the second direct current lead, and the input lead and the second direct current lead may extend through spaced apart portions of the package housing.

In some embodiments, the input lead and the second direct current lead may extend through different walls of the package housing.

In some embodiments, the first capacitor die may be connected to the first arm by a first conductive bump.

In some embodiments, an output pad region of the output leadframe may be connected to the drain terminal of the RF transistor amplifier die by a second conductive bump.

In some embodiments, the RF transistor amplifier die may be configured to operate in at least a portion of one or more of the 2.5-2.7 GHz, 3.4-4.2 GHz, or 5.1-5.8 GHz frequency bands.

In some embodiments, the RF transistor amplifier die has a Group III nitride-based semiconductor layer structure.

Pursuant to still further embodiments of the present invention, packaged RF transistor amplifiers are provided that include a package housing, an RF transistor amplifier die that is mounted within the package housing, a first output impedance matching capacitor die that is mounted within the package housing, an input leadframe that electrically connects to a gate terminal of the RF transistor amplifier die; and an output leadframe that includes an output lead that extends through the package housing to electrically connect to a drain terminal of the RF transistor amplifier die. The output leadframe is mounted on the first output impedance matching capacitor die and electrically connected to the first output impedance matching capacitor die via a first conductive bump.

In some embodiments, the first conductive bump may be one of a solder bump or a die attach material.

In some embodiments, the output leadframe may be a monolithic structure that further comprises an output pad region and a first arm, and the first arm may be directly connected to the first output impedance matching capacitor die via the first conductive bump.

In some embodiments, the output leadframe further comprises a second arm that is directly connected to a second output impedance matching capacitor die by a second conductive bump.

In some embodiments, a distal end of the first arm may be outside the package housing.

In some embodiments, the output lead may extend through a first wall of the package housing, and the distal end of the first arm may extend through a second wall of the package housing that is different from the first wall.

In some embodiments, the output lead may extend through a first wall of the package housing, and the distal end of the first arm extends through the first wall of the package housing.

In some embodiments, the input leadframe may be a monolithic structure that includes an input pad region, the input lead, and a third arm that extends from the input pad region to outside the package housing.

In some embodiments, the RF transistor amplifier die may be configured to operate in at least a portion of one or more of the 2.5-2.7 GHz, 3.4-4.2 GHz, or 5.1-5.8 GHz frequency bands.

DETAILED DESCRIPTION

Figure 1A:
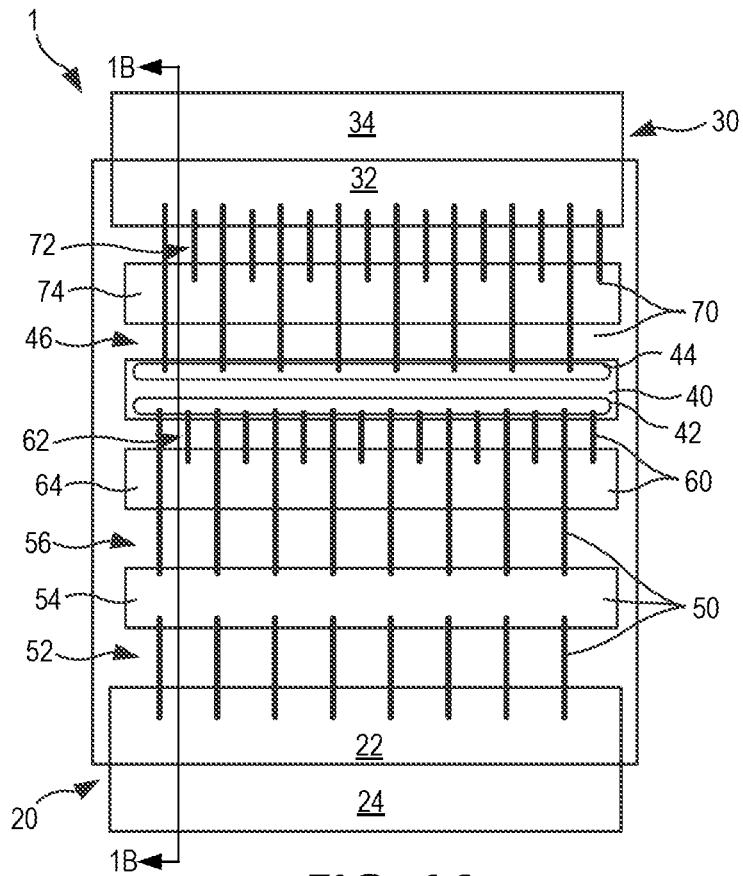
FIG. 1A is a schematic top view of a conventional packaged RF transistor amplifier that includes input and output impedance matching circuits mounted in an air-cavity package with the package walls and lid omitted.
Figure 1B:
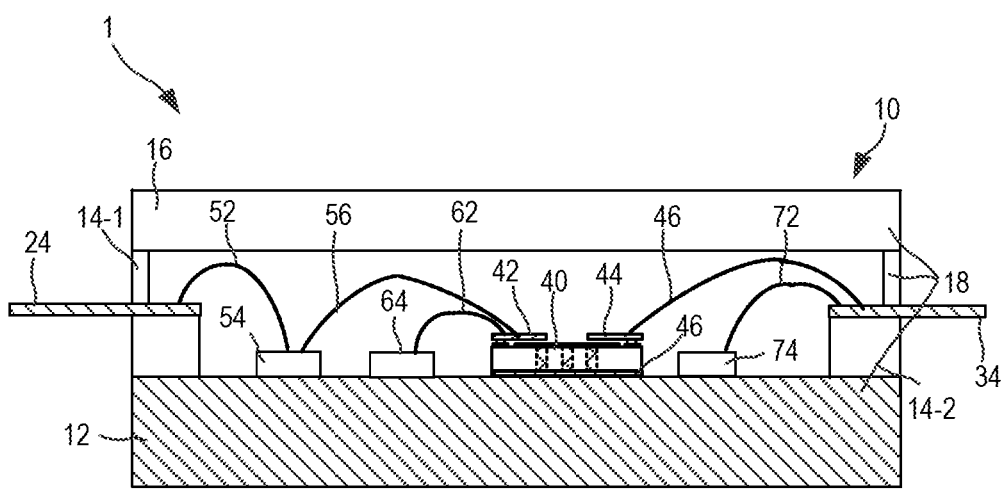
FIG. 1B is a cross-sectional view of the conventional packaged RF transistor amplifier of FIG. 1A with the walls and lid illustrated.
Figure 1C:
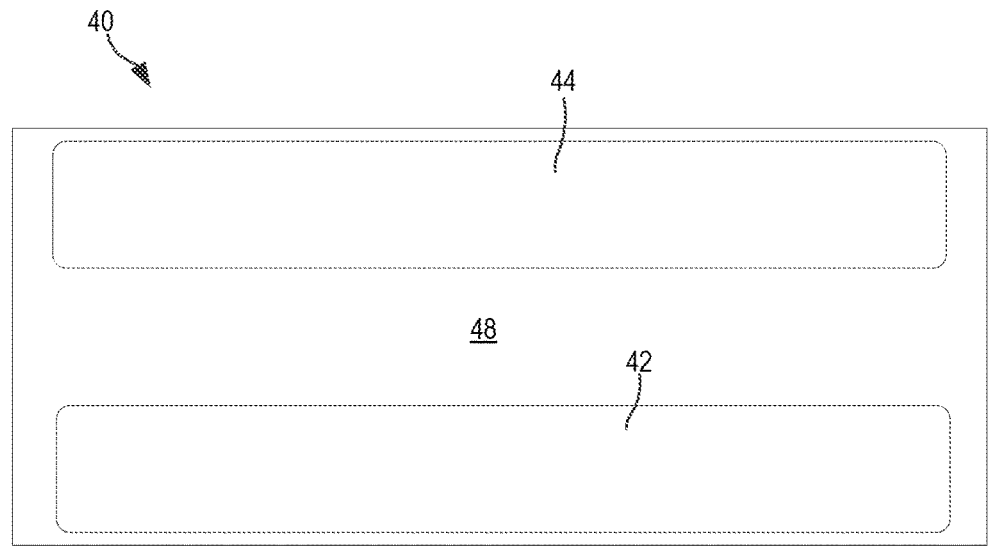
FIG. 1C is a schematic plan view of a Group III nitride-based RF transistor amplifier die that is included in the conventional packaged RF transistor amplifier of FIGS. 1A-1B.
Figure 1D:
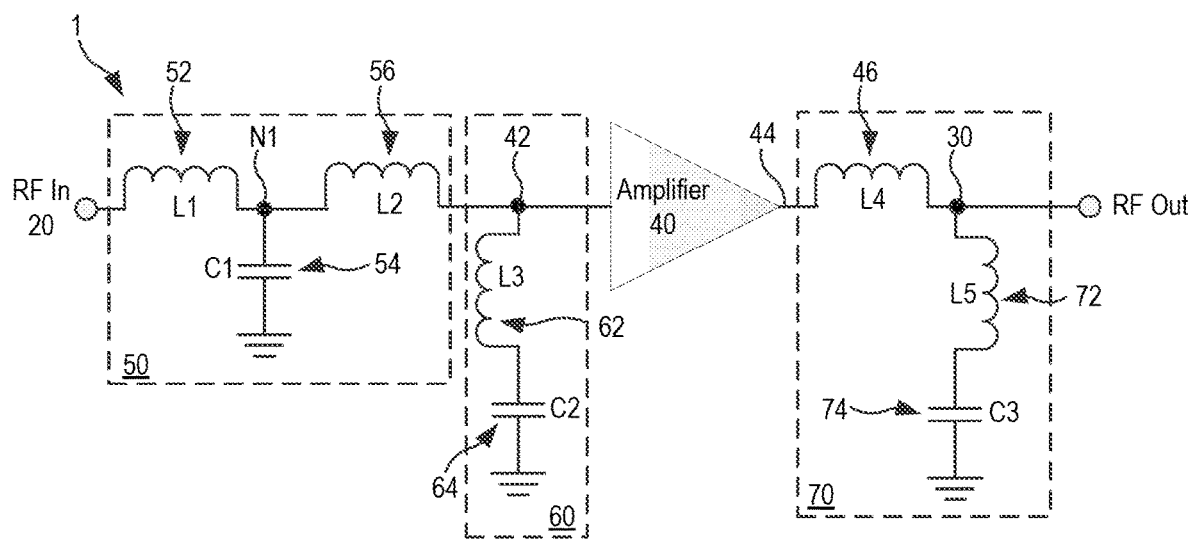
FIG. 1D is an equivalent circuit diagram of the RF transistor amplifier of FIGS. 1A-1B.
Figure 1E:
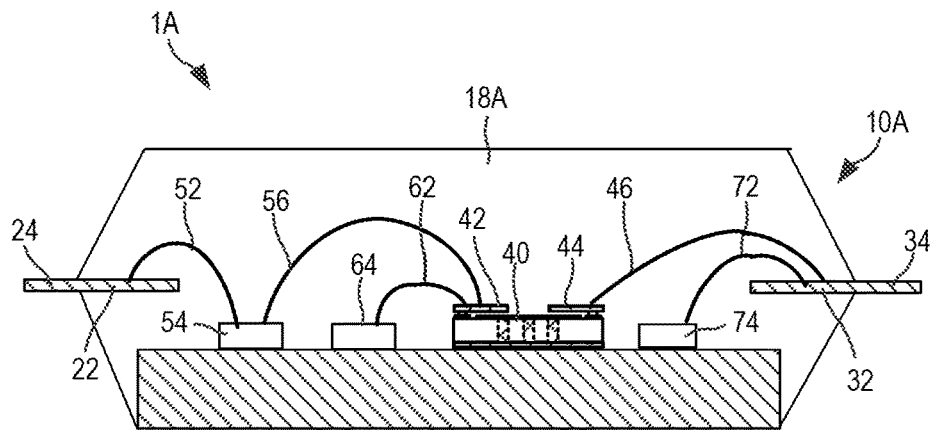
FIG. 1E is a schematic cross-sectional view of a conventional packaged RF transistor amplifier that includes a plastic overmold package.

Pursuant to embodiments of the present invention, packaged RF transistor amplifiers are provided that include one or more leadframes that have shunt inductors integrated therein. Many RF transistor amplifiers have low output impedance and hence are not well impedance matched to downstream transmission lines and/or circuit elements. Poor impedance matching may result in high return loss values, which is undesirable. In order to improve the impedance match between the output of an RF transistor amplifier and downstream transmission lines or circuit elements, RF transistor amplifiers typically include an output impedance matching circuit. This output impedance matching circuit is designed to improve the impedance match for RF signals in a particular frequency range, which typically is the operating frequency range of the RF transistor amplifier. One commonly used output impedance matching circuit is a so-called shunt-LC circuit that comprises a capacitor (C) and an inductor (L) that are coupled in series between the output of the RF transistor amplifier die and ground. As described above, the capacitor may be implemented using a capacitor die and the inductor is often implemented using bond wires.

There are several potential problems with conventional shunt-LC output impedance matching circuits for RF transistor amplifiers. First, bond wires are typically soldered between two elements, and the overall structure (i.e., the bond wires and associated solder joints) tends to have a lower Q-factor and hence a higher loss factor. Second, bond wires, like any conductive path, have an inherent inductance. The amount of inductance provided by the bond wires may be varied by changing the length and/or the cross-sectional area (e.g., the diameter) of the bond wires so that the bond wires provide a desired amount of inductance. Unfortunately, in some applications (particularly higher frequency applications), the inductance of even very short, thick bond wires may exceed a desired amount of inductance for the output impedance matching circuit. When this occurs, the output impedance matching circuit may not be able to obtain a good impedance match. Third, the wire bonding equipment that is typically used for high volume manufacturing may have a tolerance of +/−1 mil, meaning that the length of any particular bond wire may vary by as much 2 mils from a desired length. For high frequency applications, the variation in inductance associated with 2 mils of a bond wire may be significant, and hence the performance of the matching circuits may be degraded if the bond wires are too short or long from a desired nominal length.

Pursuant to embodiments of the present invention, the bond wires that are used to form the inductor in a shunt-LC output impedance matching circuit may be partly or completely replaced with a metal bar. This metal bar may be formed as part of the output leadframe of the RF transistor amplifier so that the output leadframe includes both an output lead and at least one metal bar or "arm" that is integral with the output lead. This technique may be applied to a wide variety of packaged RF transistor amplifiers, including overmold packaged RF transistor amplifiers, ceramic open-cavity packaged RF transistor amplifiers and plastic open-cavity packaged RF transistor amplifiers.

Implementing the inductor of the shunt-LC output impedance matching circuit using an extra arm on the output leadframe provides an easy to manufacture and cost-effective solution to the problems with conventional techniques. The metal arm may have an increased Q-factor as compared to bond wires, and hence the loss associated with the inductor may be reduced and the power and efficiency of the RF transistor amplifier may be increased. This solution may also reduce the part count and simplify fabrication, at least in embodiments where bond wires are completely omitted from the output impedance matching circuit. The solution may also improve mechanical placement accuracy and eliminate the length variation associated with bond wires formed using high-volume manufacturing equipment, thereby increasing the consistency of performance. Moreover, the width and/or thickness of the metal arm can be increased to a greater degree than can the dimensions of a bond wire, and hence the metal arm may have lower overall inductance as compared to conventional bond wire solutions, allowing for improved impedance matching and/or use in higher frequency applications.

Figure 14:
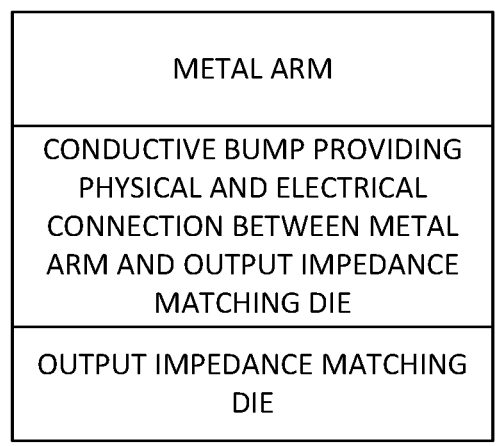
FIG. 14 is a schematic diagram illustrating how a metal arm may extend above an output impedance matching capacitor die and be physically and electrically connected to the output impedance matching capacitor die using a conductive bump.

In some embodiments, the metal arm of the output leadframe may extend next to an output impedance matching capacitor die, and short bond wires may be used to electrically connect the metal arm to the output impedance matching capacitor die. In other embodiments, the metal arm may extend above the output impedance matching capacitor die and may be physically and electrically connected to the output impedance matching capacitor die using conductive bumps (solder balls, solder pads, die attach material, etc.) as is shown in FIG. 14. This may eliminate the need for any bond wires in the shunt-LC output impedance matching circuit.

In some embodiments, the metal arm may extend through a wall of the package housing. In such embodiments, the distal end of the metal arm may act as a direct current (DC) voltage source input that may receive a DC voltage that biases the drain terminal of the RF transistor amplifier die. The metal arm may be configured to act as an inductor that blocks RF currents from flowing to the DC voltage source. This technique may better decouple the DC voltage source from the RF path, and may increase the bandwidth of the RF transistor amplifier die.

In some embodiments, the same or similar techniques may be applied to the input of the RF transistor amplifier die. In particular, the input may be implemented as a metal leadframe that includes an input pad, an input lead and a metal arm that is formed integrally therewith. The metal arm may provide some or all of the inductance of an input impedance matching or harmonic termination circuit in some embodiments. In some embodiments, the metal arm may extend through a wall of the package housing to act as a DC voltage source input that may receive a DC voltage that biases the gate terminal of the RF transistor amplifier die.

In some embodiments, packaged RF transistor amplifiers are provided that include a package housing, an RF transistor amplifier die that is mounted within the package housing, a first capacitor die that is mounted within the package housing, an input leadframe that extends through the package housing to electrically connect to a gate terminal of the RF transistor amplifier die, and an output leadframe that extends through the package housing to electrically connect to a drain terminal of the RF transistor amplifier die. The output leadframe includes an output pad region, an output lead that extends outside of the package housing, and a first arm that extends from one of the output pad region and the output lead to be adjacent the first capacitor die.

In other embodiments, packaged RF transistor amplifiers are provided that include a package housing, an RF transistor amplifier die that is mounted within the package housing, an input leadframe that includes an input lead that extends through the package housing to electrically connect to a gate terminal of the RF transistor amplifier die, and a monolithic output leadframe that includes an output lead, a direct current lead and an electrical connection between the output lead and the direct current lead. The output lead extends through a first portion of the package housing to electrically connect to a drain terminal of the RF transistor amplifier die, and the direct current lead extends through a second portion of the package housing that is spaced apart from the first portion of the package housing.

In still other embodiments, packaged RF transistor amplifiers are provided that include a package housing, an RF transistor amplifier die that is mounted within the package housing, a first output impedance matching capacitor die that is mounted within the package housing, an input leadframe that electrically connects to a gate terminal of the RF transistor amplifier die, and an output leadframe that includes an output lead that extends through the package housing to electrically connect to a drain terminal of the RF transistor amplifier die. The output leadframe is mounted on the first output impedance matching capacitor die and electrically connected to the first output impedance matching capacitor die via a first conductive bump.

Embodiments of the present invention will now be discussed in further detail with reference to FIGS. 2A-12.

Figure 2A:
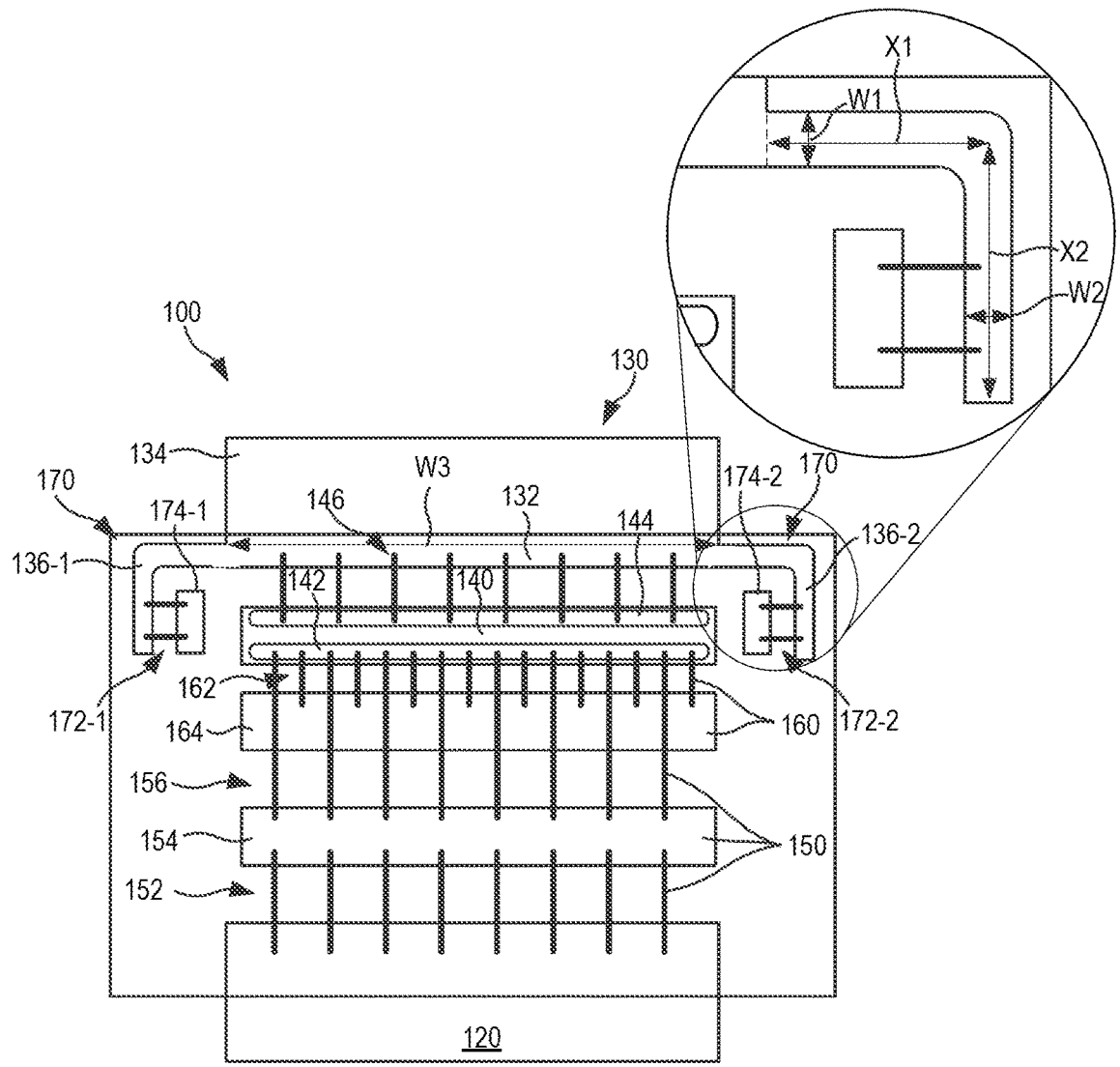
FIG. 2A is a schematic top view of an open-cavity RF transistor amplifier according to embodiments of the present invention with the package walls and lid omitted.
Figure 2B:
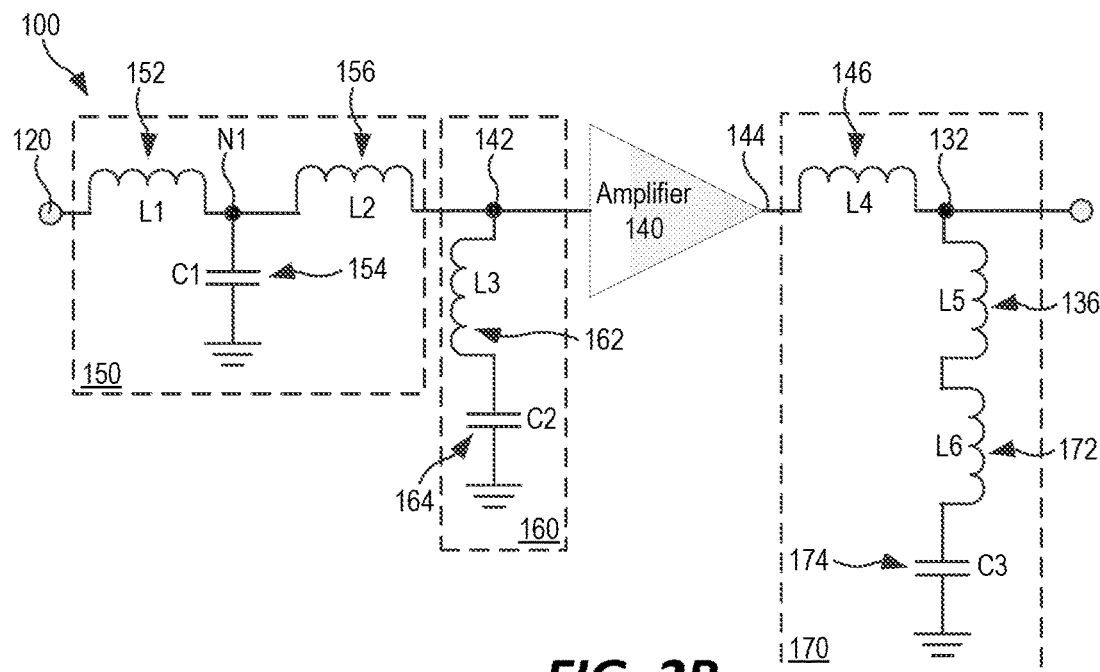
FIG. 2B is an equivalent circuit diagram of the RF transistor amplifier of FIG. 2A.
Figure 2C:
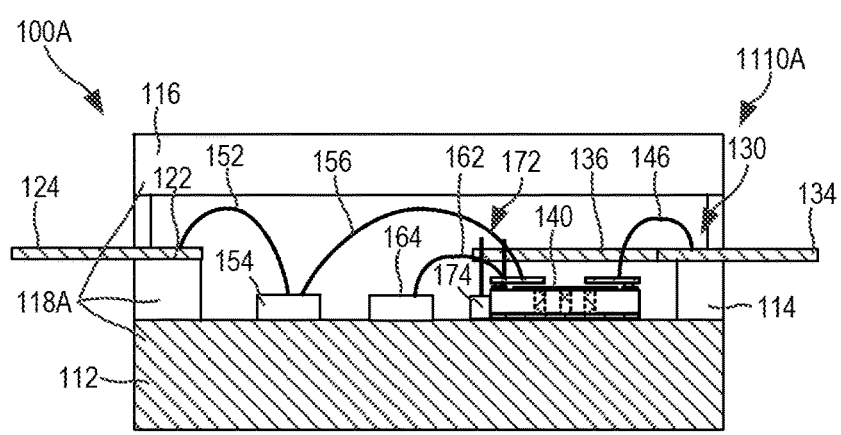
FIG. 2C is a cross-sectional view of the RF transistor amplifier of FIG. 2A implemented as an open-cavity package.
Figure 2D:
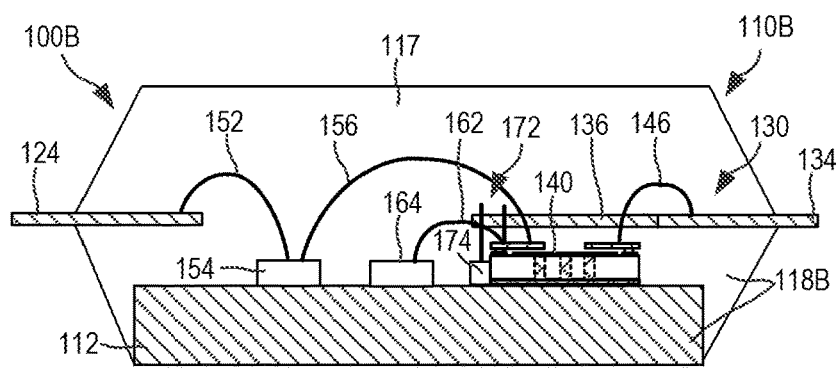
FIG. 2D is a cross-sectional view of the RF transistor amplifier of FIG. 2A implemented as a plastic overmold package.

FIG. 2A is a schematic top view of an RF transistor amplifier 100 according to embodiments of the present invention. FIG. 2B is an equivalent circuit diagram of the RF transistor amplifier 100 of FIG. 2A. FIGS. 2C and 2D illustrate the RF transistor amplifier 100 of FIG. 2A implemented as an open-cavity packaged RF transistor amplifier 100A (FIG. 2C) and as a plastic overmold packaged RF transistor amplifier 100B (FIG. 2D).

As shown in FIG. 2A, the RF transistor amplifier 100 comprises a plurality of circuit components that are mounted on a submount 112. The submount 112 may comprise, for example, a metal block. Other submounts may be used, however, including printed circuit boards, metallized dielectric blocks, ceramic structures with metallization formed thereon, redistribution laminate structures, carrier substrates and the like. The submount 112 may provide an electrical connection to ground, as will be discussed further below. The submount 112 may include materials and/or structures that are configured to assist with dissipating heat that is generated in an RF transistor amplifier die that is mounted on the submount 112. For example, the submount 112 may include copper and/or molybdenum in some embodiments. In an example embodiment, the submount 112 may be a multilayer copper/molybdenum/copper metal block that comprises a core molybdenum layer with copper cladding layers on either major surface thereof. In some embodiments, the submount 112 may be composed of multiple layers and/or contain vias/interconnects. In some embodiments, the submount 112 may include a metal heat sink that is part of a metal slug that is at least partially surrounded by an overmold plastic.

The circuit components that are mounted on the submount 112 include an RF transistor amplifier die 140, an input impedance matching capacitor die 154, an input harmonic termination capacitor die 164, and a pair of output impedance matching capacitor die 174-1, 174-2. The input impedance matching capacitor die 154 is part of an input impedance matching circuit 150, the harmonic termination capacitor die 164 is part of an input harmonic termination circuit 160, and the output impedance matching capacitor die 174-1, 174-2 are part of an output impedance matching circuit 170. Each die 140, 154, 164, 174-1, 174-2 may have a terminal on its bottom side that is electrically connected to the submount 112 by, for example, a conductive die attach material (not shown). The capacitor die 154, 164, 174-1, 174-2 may be implemented, for example, as integrated passive device ("IPD") capacitor die that include one or more capacitors formed on one or more thin film substrates such as silicon, alumina, or glass using semiconductor processing techniques. Other capacitor die may alternatively be used such as, for example, surface mount capacitor chips or printed circuit board based surface mount capacitors. The capacitor die 154, 164, 174-1, 174-2 may include one large capacitor or may include a plurality of capacitors that may be electrically connected (e.g., in parallel) to act like a single, large capacitor, and hence herein the capacitor die 154, 164, 174-1, 174-2 will be referred to as if they include a single capacitor having first and second electrodes. In some embodiments, the first electrode may be provided on a top surface of each capacitor die 1154, 164, 174-1, 174-2 and the second electrode may be provided on a bottom surface of each capacitor die 154, 164, 174-1, 174-2.

In some embodiments, the RF transistor amplifier die 140 may comprise a Group III nitride-based RF transistor amplifier die or a silicon LDMOS RF transistor amplifier die. The RF transistor amplifier die 140 may include a plurality of unit cell transistors that are electrically connected in parallel, as will be discussed in greater detail below with reference to FIGS. 11A-11D. Each unit cell transistor may comprise a field effect transistor that has a gate terminal 142 which acts as the RF input to RF transistor amplifier die 140 and a drain terminal 144 which acts as the RF output to RF transistor amplifier die 140. The RF transistor amplifier die 140 further includes a source terminal 146. In some embodiments, the source terminal 146 may be on the bottom side of the RF transistor amplifier die 140 and may be electrically connected to source regions in a semiconductor layer structure of the RF transistor amplifier die 140 via source vias (not shown) that extend through the semiconductor layer structure. In other embodiments, the source terminal 146 may also be on the top side of the RF transistor amplifier die 140.

The input impedance matching circuit 150 includes a set of first bond wires 152, the input impedance matching capacitor die 154 and a set of second bond wires 156. Proximate ends of the first bond wires 152 are coupled to the input leadframe 120 and distal ends of the first bond wires 152 are coupled to the first electrode of the input impedance matching capacitor die 154. The second electrode of the input impedance matching capacitor die 154 is mounted on the bottom side of the input impedance matching capacitor die 154 so that it is electrically connected to the submount 112 (and hence is electrically coupled to electrical ground). The second bond wires 156 extend between the first electrode of the input impedance matching capacitor die 154 and the gate terminal 142 of the RF transistor amplifier die 140. The second bond wires 156 pass over the harmonic termination capacitor die 164.

The harmonic termination circuit 160 includes a set of third bond wires 162 and the harmonic termination capacitor die 164. The third bond wires 162 are coupled between the gate terminal 142 of RF transistor amplifier die 140 and a first electrode of the harmonic termination capacitor die 164. The second electrode of the harmonic termination die 164 is mounted on the bottom side of the die to be electrically connected to the submount 112 (which may be maintained at electrical ground).

A set of fourth bond wires 146 extend between the drain terminal 144 of RF amplifier die 140 and the output leadframe 130. The output leadframe 130 may comprise an output pad 132 that is within the package housing 118, an output lead 134 that extends from the output pad 132, and a pair of arms 136-1, 136-2 that extend from the output pad 132. In other embodiments, one or both arms 136 may extend from the output lead 134. Each arm 136 may have an L-shape, and the two arms 136 may face each other so that the two arms 136 and the proximate portion of the output pad 132 define a generally U-shaped structure. The output lead 134 extends through a wall of the housing of RF transistor amplifier 100, as will be explained in more detail below with reference to FIGS. 2C and 2D. Each arm 136 may have a length, a width and a depth, where the depth direction corresponds to the smallest dimension (the thickness) of the output pad 132. The length of each arm 136 is equal to the sum of the lengths X1, X2, . . . of each segment of the arm 136, where the length of each segment is the length of the current path along the segment. The circular call-out in FIG. 2A illustrates the lengths X1 and X2 of the two segments of arm 136-2. The "width" of each arm 136 refers to the average width of the arm 136, where the width direction for each segment of the arm 136 is perpendicular to the length direction. Referring to the callout in FIG. 2A, the width of arm 136-2 may be calculated as:

$$\text{Width}=[(X1*W1)/(X1+X2)]+[(X2*W2)/(X1+X2)]$$

The width of each arm 136 (as determined above) may be substantially smaller than the width W3 (see FIG. 2A) of the output pad 132. In some embodiments, the width of each arm 136 may be less than half the width of output pad 132. In other embodiments, the width of each arm 136 may be less than a third the width of output pad 132. In still other embodiments, the width of each arm 136 may be less than a quarter the width of output pad 132.

The output impedance matching circuit 170 comprises the metal arms 136-1, 136-2, two sets of fifth bond wires 172-1, 172-2, and the output impedance matching capacitor die 174-1, 174-2. In the embodiment of FIG. 2A, the output impedance matching circuit 170 includes two separate circuits, one of which is shown on the left side of FIG. 2A and the other which is shown on the right side of FIG. 2A. As the two circuits are identical and electrically coupled in parallel, the following discussion will only describe the circuit on the left side of FIG. 2A. This portion of the output impedance matching circuit 170 includes arm 136-1 of leadframe 130, which is coupled to output pad 132 and forms an inductance L5/2. The fifth bond wires 172-1 are coupled between the distal end of arm 136-1 and a first (top side) electrode of the output impedance matching capacitor die 174-1. The fifth bond wires 172-1 form an inductance L6/2. The output impedance matching capacitor die 174-1 forms a capacitance C3/2. The second electrode of the output impedance matching capacitor die 174-1 is mounted on the bottom side of the die to be electrically connected to the submount 112 (which may be maintained at electrical ground).

FIG. 2B is an equivalent circuit diagram of the RF transistor amplifier 100. As shown in FIG. 2B, RF signals are input at the input leadframe 120. The set of first bond wires 152 acts as a series inductance L1 between the input leadframe 120 and a node N1, which is the first electrode of the input impedance matching capacitor die 154. The second electrode of the input impedance matching capacitor die 154 is coupled to ground through submount 112 to form a shunt capacitance C1. The set of second bond wires 156 acts as a series inductance L2 between node N1 and the gate terminal 142 of the RF transistor amplifier die 140. The set of third bond wires 162 acts as an inductance L3 and the input harmonic termination capacitor die 164 forms a capacitance C2. The inductance L3 and the capacitance C2 are coupled in series between the gate terminal 142 and electrical ground, forming the shunt input harmonic termination circuit 160.

The drain terminal 144 of RF transistor amplifier die 140 is connected by the set of fourth bond wires 146 to the output pad 132 of the output leadframe 130. The fourth set of bond wires 146 acts as a series inductance L4. The amplified RF signals output at the drain terminal 144 are output through the output pad 132 to an external circuit (not shown). As described above, the metal arms 136-1, 136-2 together form an inductance L5 and the two sets of fifth bond wires 172-1, 172-2 together form an inductance L6. The output impedance matching capacitor die 174-1, 174-2 together form a capacitance C3. The inductance L5, the inductance L6 and the capacitance C3 are coupled in series between the output pad 132 and electrical ground, forming the shunt output impedance matching circuit 170.

The RF transistor amplifier 100 may have a number of advantages over the RF transistor amplifier 1 discussed above. First, the fourth bond wires 46 included in the output impedance matching circuit 70 of RF transistor amplifier 1 are relatively long bond wires. This may result in the inductance of the output impedance matching circuit 70 being higher than optimum, which may degrade the output impedance match and hence reduce the operating bandwidth of the RF transistor amplifier. Shorter bond wires 146 are used in RF transistor amplifier 100 in conjunction with the arms 136-1, 136-2. The width and depth of the arms 136-1, 136-2 may be made to be larger (and potentially substantially larger) than the diameter of the bond wires 46/146, and hence the arms 136-1, 136-2 may have much lower inductance than corresponding bond wires. Thus, the inductance in the output impedance matching circuit 170 may be lower than the inductance in the output impedance matching circuit 70, which may improve performance in applications where only a minimal amount of inductance is required.

Additionally, a less dense pattern of bond wires connect to the output pad 132 (since the fifth bond wires 172 connect to the metal arms 136 as opposed to the output pad 132), which may allow for use of larger bond wires (which have lower inductance), potentially further improving performance. Moreover, as discussed above, the metal arms may have an increased Q-factor as compared to bond wires, and hence the loss associated with the inductor may be reduced and the power and efficiency of RF transistor amplifier 100 may be increased as compared to RF transistor amplifier 1.

FIG. 2C is a cross-sectional view of the RF transistor amplifier 100 of FIG. 2A shown in an open-cavity package to provide an open-cavity packaged RF transistor amplifier 100A. As shown in FIG. 2C, the packaged RF transistor amplifier 100A includes a package 110A that includes the submount 112, walls 114 and a lid 116 that together form a package housing 118A. The walls 114 and lid 116 may be formed of an insulating material such as, for example, a ceramic material, a plastic or a plastic polymer compound. In some embodiments, the walls 114 and/or lid 116 may be formed of, for example, $Al_2O_3$. The lid 116 may be glued to the walls 114 using an epoxy glue. The walls 114 may be attached to the submount 112 via, for example, braising. The submount 112, walls 114 and lid 116 may define a cavity. The package 110A further includes the above-discussed input leadframe 120 and output leadframe 130. Each leadframe 120, 130 extends through a respective wall 114 of the package housing 118.

FIG. 2D is a cross-sectional view of the RF transistor amplifier 100 of FIG. 2A shown in an overmold package to provide a plastic overmold packaged RF transistor amplifier 100B. As shown in FIG. 2D, the packaged RF transistor amplifier 100B includes a package 110B that includes the submount 112 and an overmold material 117, such as a plastic or a plastic polymer compound that is injection molded around the circuit elements, that together form a package housing 118B. The package 110B further includes the input leadframe 120 and the output leadframe 130. The package 110B provides protection from the outside environment.

Figure 3A:
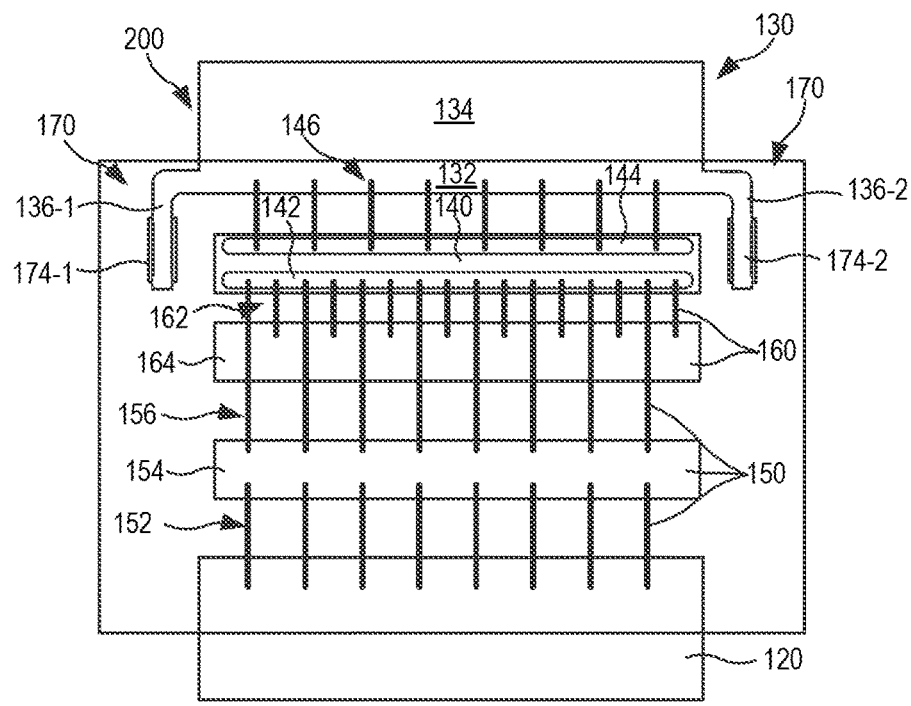
FIG. 3A is a schematic top view of a modified version of the packaged RF transistor amplifier of FIG. 2A.

FIG. 3A is a schematic top view of an RF transistor amplifier 200 that is a modified version of the RF transistor amplifier of FIG. 2A. As can be seen by comparing FIGS. 2A and 3A, the RF transistor amplifiers 100 and 200 are very similar, with the only difference being in the output impedance matching circuit 170. As described above, in RF transistor amplifier 100, the arms 136-1 and 136-2 are connected to the respective output impedance matching capacitor die 174-1, 174-2 by respective sets of fifth bond wires 172-1, 172-2. In contrast, in RF transistor amplifier 200, the arms 136-1 and 136-2 are designed to vertically overlap the respective output impedance matching capacitor die 174-1, 174-2 so that they may be electrically connected thereto using conductive bumps such as solder bumps, solder pads, die attach material, or the like. By using conductive bumps to connect the arms 136 to the respective output impedance matching capacitor die 174, the need for bond wires in the output impedance matching circuit 170 may be reduced or eliminated. This may allow for further reduction in the total inductance in the output impedance matching circuit 170 and may also replace the bond wiring fabrication step with a faster conductive bump operation. Moreover, be reducing or eliminating the need for bond wires, the variation in inductance that result from bond wiring tolerance issues may be eliminated, resulting in improved performance, and the Q factor of the device may be further improved.

Figure 3B:
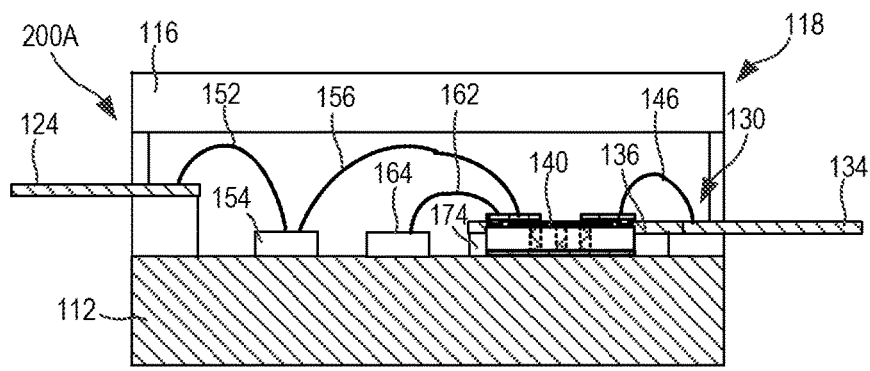
FIG. 3B is a cross-sectional view of the RF transistor amplifier of FIG. 3A implemented as an air cavity package.
Figure 3C:
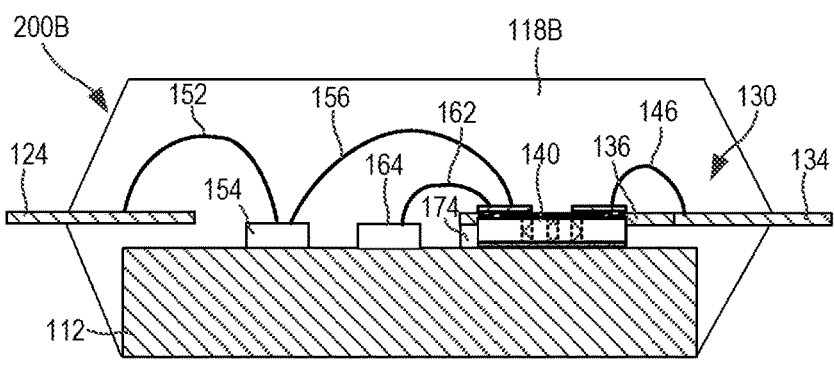
FIG. 3C is a cross-sectional view of the RF transistor amplifier of FIG. 3A implemented as a plastic overmold package.

FIGS. 3B and 3C are cross-sectional views of the RF transistor amplifier 200 of FIG. 3A implemented as an open-cavity package RF transistor amplifier and as a plastic overmold RF transistor amplifier, respectively. As all of the components of these devices have been discussed above with reference to FIGS. 2A-3A, and hence further description thereof will be omitted.

Figure 4:
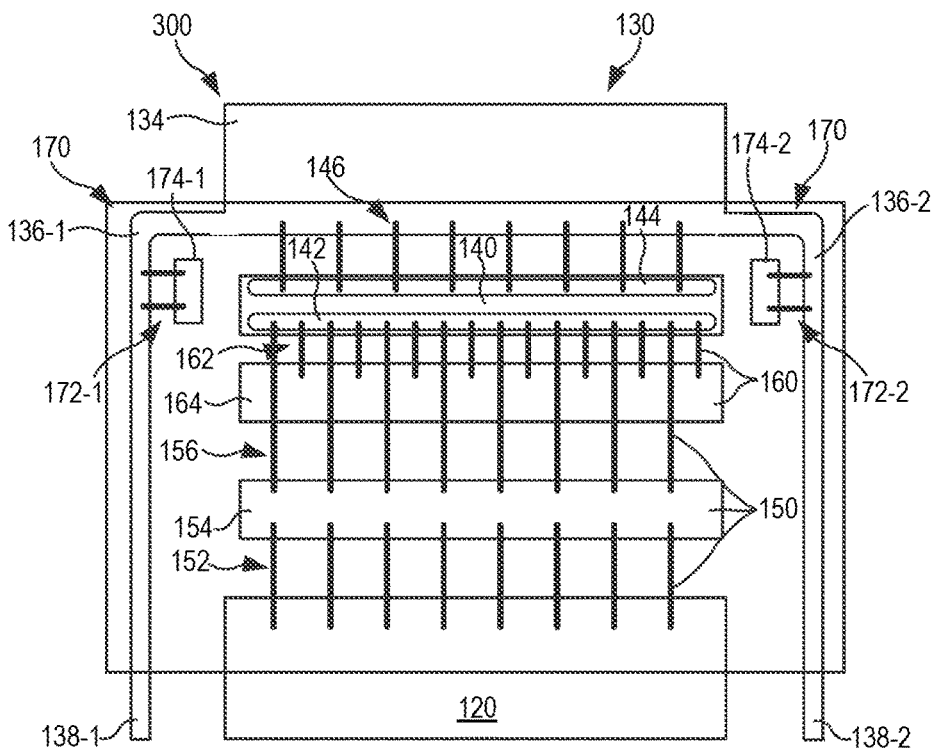
FIG. 4 is a schematic top view of an RF transistor amplifier according to further embodiments of the present invention.

FIG. 4 is a schematic top view of an RF transistor amplifier 300 according to further embodiments of the present invention. The RF transistor amplifier 300 is again very similar to the RF transistor amplifier 100 of FIG. 2A, with the only difference being that each arm 136-1, 136-2 is extended so that the arms 136-1, 136-2 extend all of the way across the submount 112 and extend through a front wall of the package housing. The distal ends of arms 136-1, 136-2 may serve as DC voltage source inputs 138-1, 138-2 that receive the DC bias voltage for the drain terminal 144 of RF transistor amplifier 140. Note that each DC voltage source input 138 is connected to the drain terminal 144 through the arms 136, output pad 132 and the fourth set of bond wires 146. In the embodiment of FIG. 4, the DC voltage source inputs 138-1, 138-2 extend through the front wall of the package, which is the same wall that the input leadframe 120 extends through. The length and width of the arms 136 (or portions thereof) may be designed so that the arms 136 act as inductors that block RF signals output from RF transistor amplifier die from flowing back to the DC bias voltage source. By connecting the DC voltage source for the drain terminal 144 through paths that are mostly not part of the RF signal output path (which is output pad 132 and the output lead 134), the video bandwidth of the RF transistor amplifier 300 may be improved.

Figure 5:
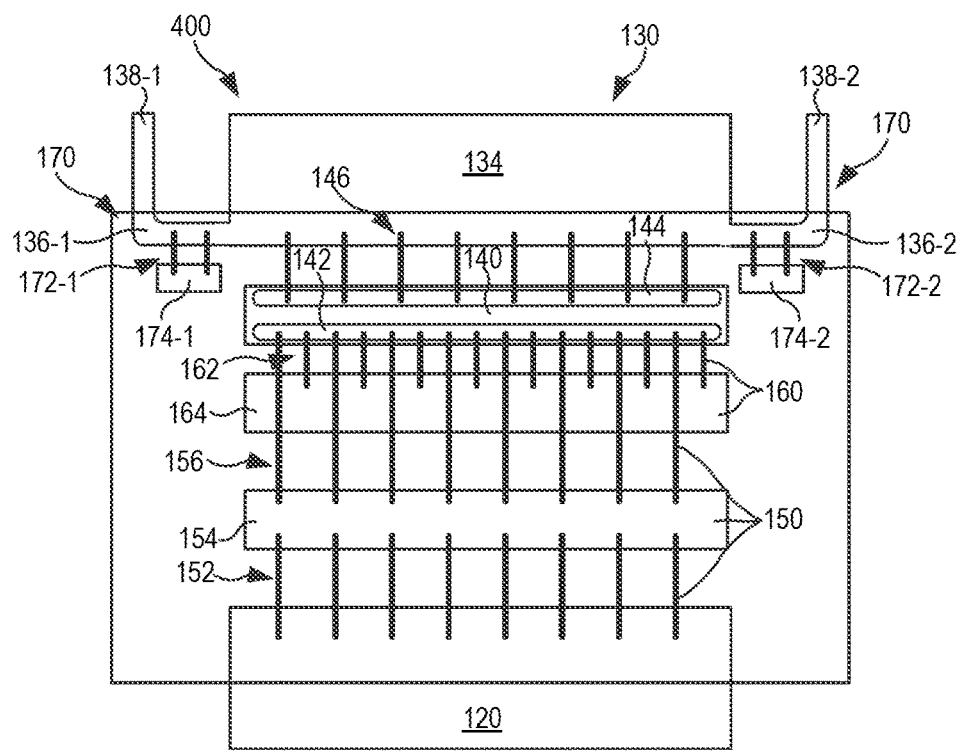
FIG. 5 is a schematic top view of a packaged RF transistor amplifier according to still further embodiments of the present invention.
Figure 6:
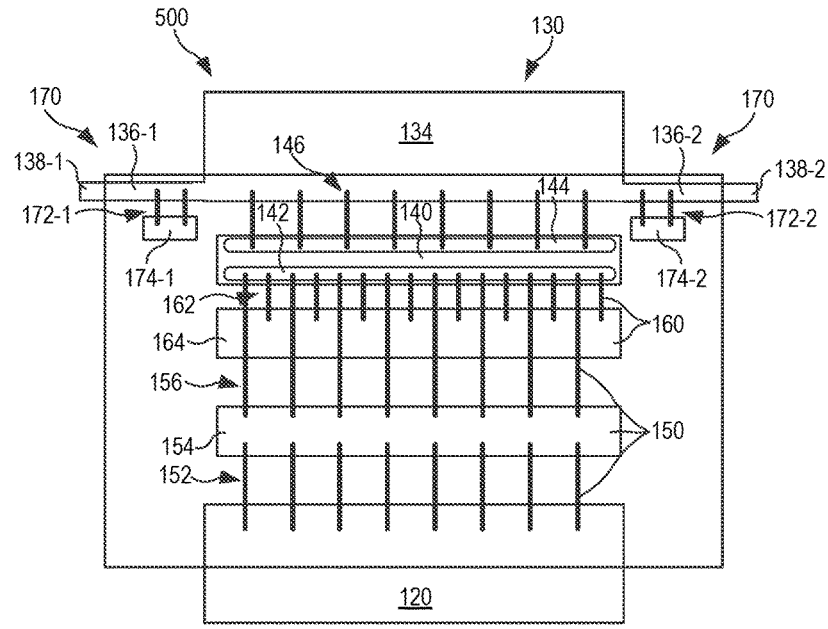
FIG. 6 is a schematic top view of an RF transistor amplifier according to further embodiments of the present invention.

It will be appreciated that the DC voltage source inputs 138-1, 138-2 can extend through other portions of the package housing. For example, FIG. 5 is a schematic top view of a packaged RF transistor amplifier 400 according to further embodiments of the present invention in which the DC voltage source inputs 138-1, 138-2 extend through the rear wall of the package housing, which is the same wall that the output lead 134 extends through. FIG. 6 is a schematic top view of a packaged RF transistor amplifier 500 according to still further embodiments of the present invention in which the DC voltage source inputs 138-1, 138-2 extend through the side walls of the package (i.e., the walls that extend between the front and rear walls). In the above RF transistor amplifiers, if an open cavity package is used, then the walls refer to the walls 114 of the package housing 118 discussed above with reference to FIG. 2C. If a plastic overmold package is used, then the walls refer to walls of the plastic overmold material 117 shown in FIG. 2D. In example embodiments these packages may have four walls that extend vertically upwardly from the four sides that define the outer top surface of the submount 112, although embodiments of the present invention are not limited thereto.

Figure 7:
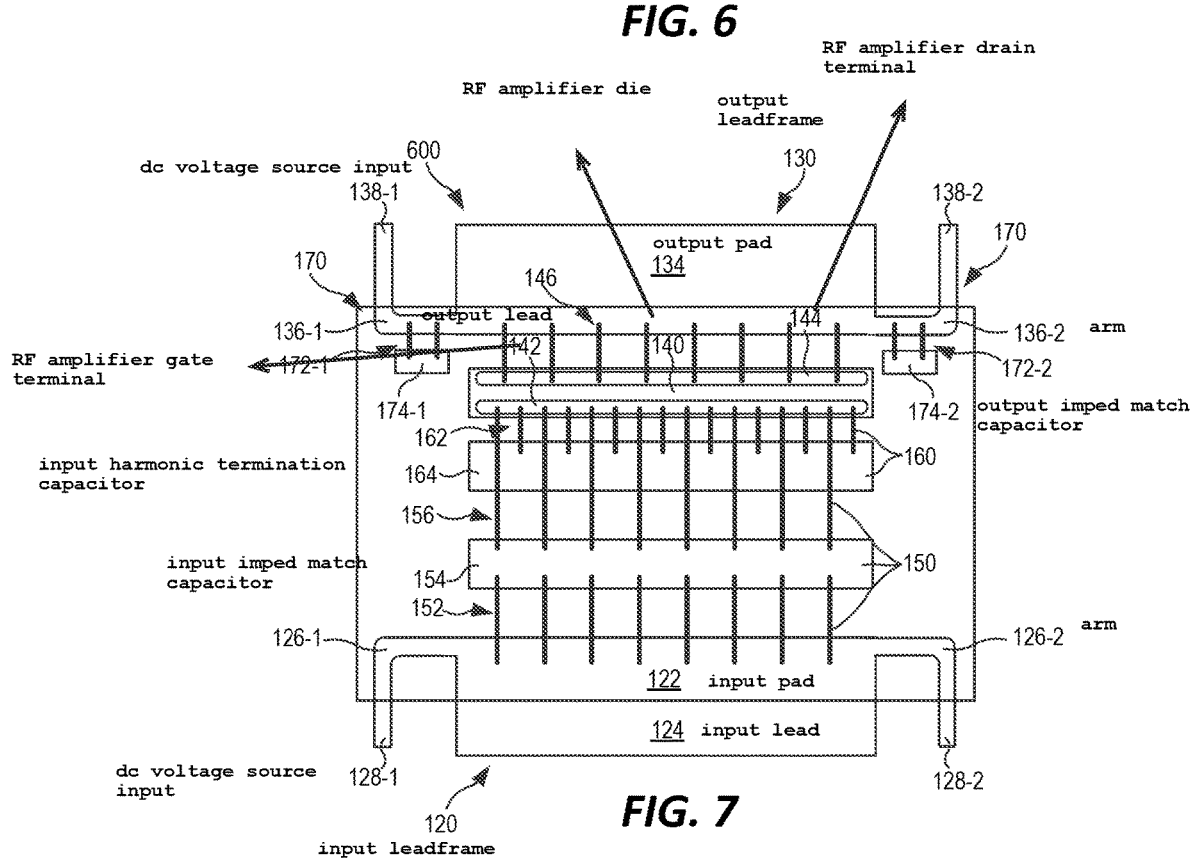
FIG. 7 is a schematic top view of an RF transistor amplifier according to additional embodiments of the present invention.
Figure 8:
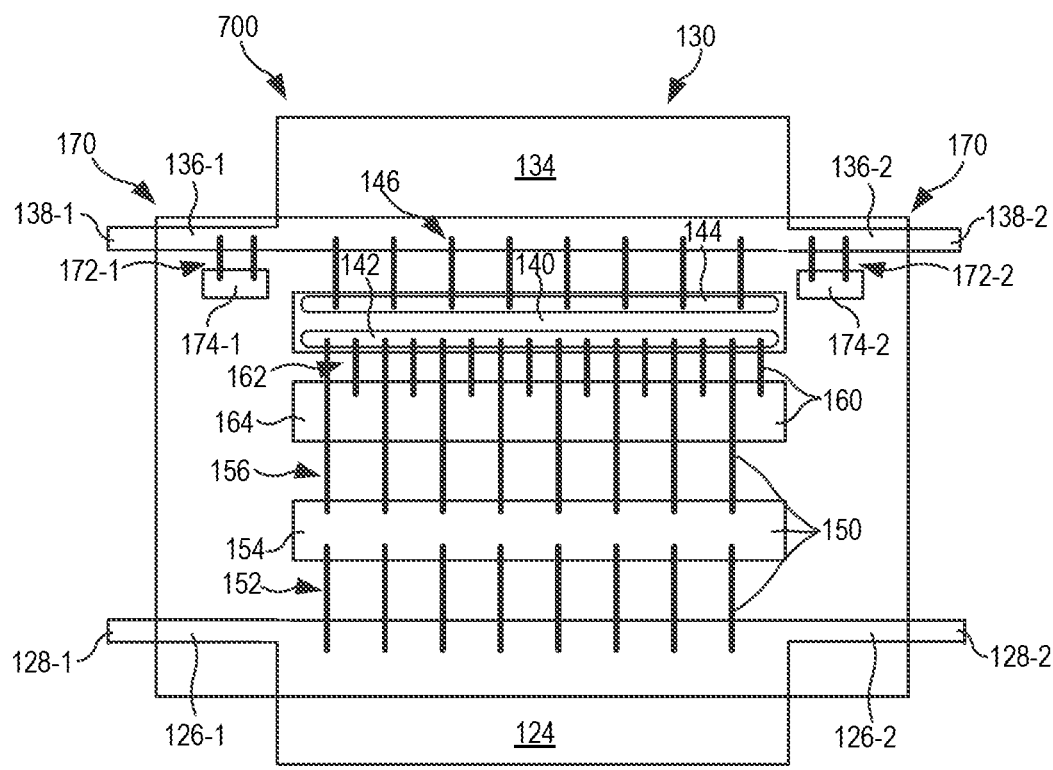
FIG. 8 is a schematic top view of an RF transistor amplifier according to further embodiments of the present invention.
Figure 9:
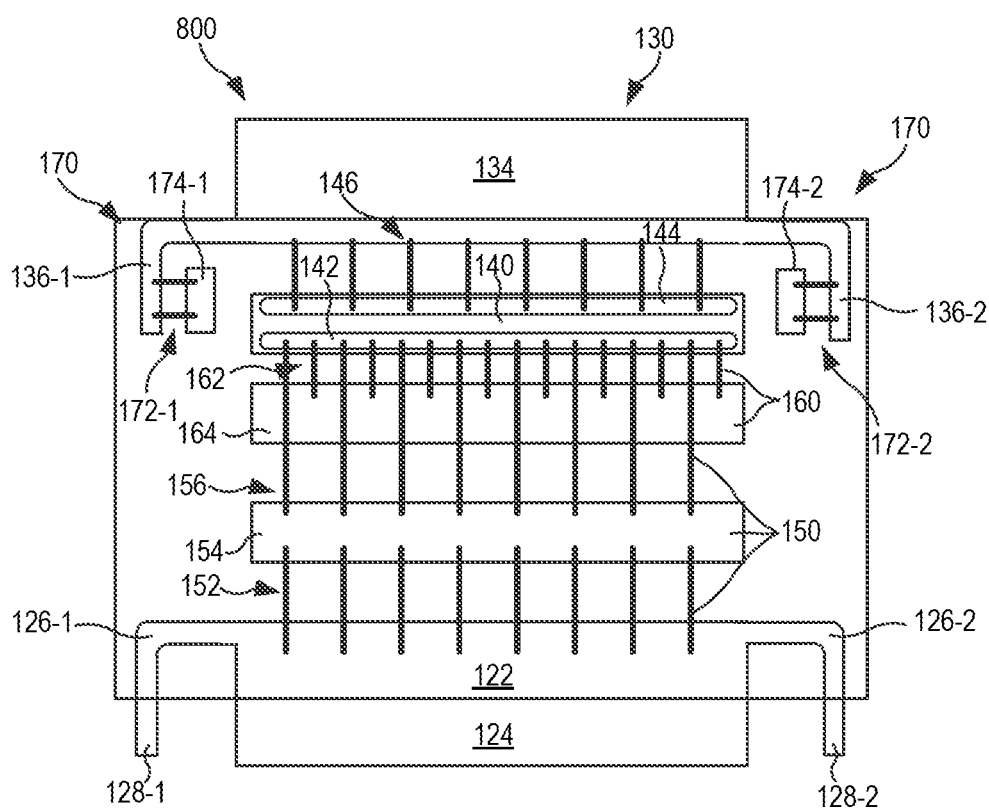
FIG. 9 is a schematic top view of an RF transistor amplifier according to further embodiments of the present invention.

Pursuant to further embodiments of the present invention, arms may alternatively or additionally be included on the input leadframe 120. FIGS. 7-9 are schematic top views of RF transistor amplifiers according to embodiments of the present invention that include arms on the input leadframe 120.

Referring first to FIG. 7, an RF transistor amplifier 600 is depicted that is similar to the RF transistor amplifier 400 of FIG. 5. The RF transistor amplifier 600, however, includes a modified version of the input leadframe 120. In particular, as shown in FIG. 7, the input leadframe 120 includes an input pad region 122, an input lead 124 and a pair of arms 126-1, 126-2 that extend from the input pad region 122. The input lead 124 extends through the front wall of the package housing 118. Each arm 126 has an L-shape, and each arm 126 also extends through the front wall of the package housing 118. The distal ends of arms 126-1, 126-2 may serve as DC voltage source inputs 128-1, 128-2 that receive the DC bias voltage for the gate terminal 142 of RF transistor amplifier 140. Each DC voltage source input 128 is connected to the gate terminal 142 through the respective arms 126, the input pad 122 and the sets of first and second bond wires 152, 156. The length and width of the arms 126 (or portions thereof) may be designed so that the arms 126 act as inductors that block RF signals from flowing back to the DC bias voltage source.

FIG. 8 is a schematic top view of an RF transistor amplifier 700 according to further embodiments of the present invention. The RF transistor amplifier 700 is similar to the RF transistor amplifier 500 of FIG. 6, but includes a modified version of the input leadframe 120 that has arms 126-1, 126-2 that extend from the input pad region 122 and through the respective side walls of the package housing 118. The distal end of each arm 126 acts as a respective DC voltage source input 128.

FIG. 9 is a schematic top view of an RF transistor amplifier 800 according to still further embodiments of the present invention that includes the input leadframe 120 of the RF transistor amplifier die 600 of FIG. 7 and the output leadframe 120 of the RF transistor amplifier die 100 of FIG. 2A.

It will be appreciated that many additional variations are possible. FIGS. 10A-10G are schematic plan views of additional examples of RF transistor amplifier die according to further embodiments of the present invention. In FIGS. 10A-10G, only the submount 112, the input leadframe 120, the output leadframe 130 and selected capacitor die 158, 174 are shown to simplify the drawings.

Figure 10A:
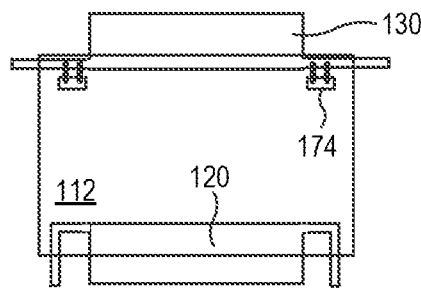
FIGS. 10A-10G are schematic plan views of additional examples of RF transistor amplifiers according to further embodiments of the present invention.
Figure 10B:
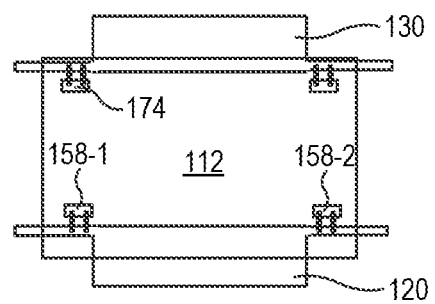

FIG. 10A illustrates an RF transistor amplifier design that includes the input leadframe 120 of the RF transistor amplifier 600 of FIG. 7 and the output leadframe 130 of the RF transistor amplifier 500 of FIG. 6. FIGS. 10B and 10D each illustrate that the arms 126 of the input leadframe 120 may extend next to, and be electrically connected to, input capacitor die 158 which may be part of input impedance matching or input harmonic termination circuits. While bond wires are used to physically and electrically connect the arms 126 to the input capacitor die in the embodiments of FIGS. 10B and 10D, it will be appreciated that in other embodiments, the arms 126 may extend directly over top of the respective input capacitor die 158 and may be physically and electrically connected thereto via conductive bumps in the same manner that the arms 136 of RF transistor amplifier 200 of FIG. 3A are connected to the output impedance matching capacitor die 174.

Figure 10C:
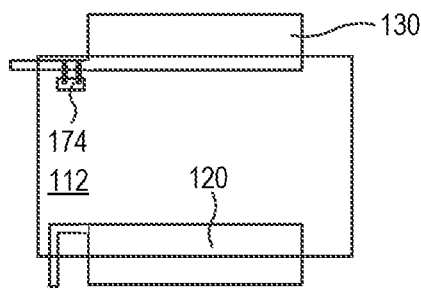
Figure 10D:
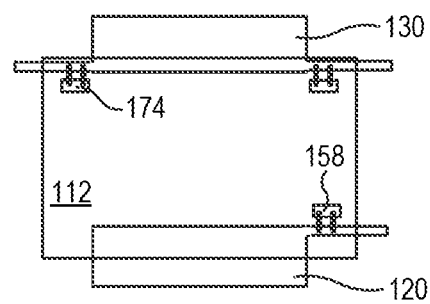
Figure 10E:
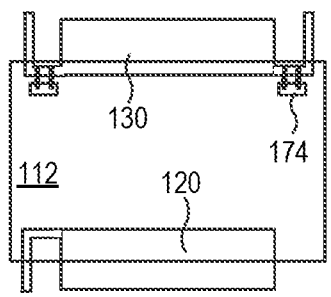
Figure 10F:
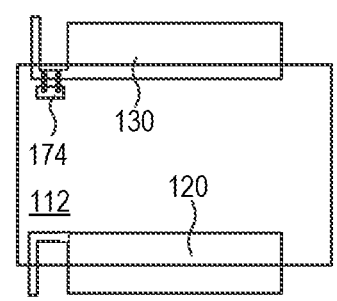
Figure 10G:
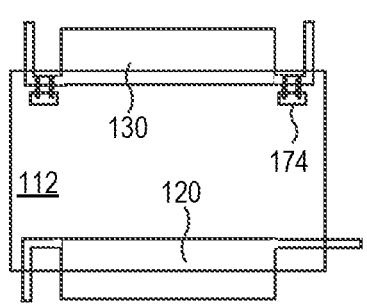

FIGS. 10C-10F illustrate how the input leadframe 120 may include a single arm 124 in some embodiments that may act as a DC voltage source input for the gate terminal of RF transistor amplifier die 140. FIGS. 10C and 10F similarly illustrate how the output leadframe 130 may include a single arm 136 in some embodiments that may act as a DC voltage source input for the drain terminal of RF transistor amplifier die 140 and which may connect to the output impedance matching capacitor die 174. FIG. 10G illustrates how the input leadframe 120 may include arms 126 having different designs. This technique may also be used on the output leadframe 130 in other embodiments. FIGS. 10A-10G also illustrate how the various designs for the arms 126, 136 may be mixed and matched to provide additional embodiments. All possible combinations of the various arm designs (including their connections to capacitor die and whether or not they extend outside the package housing to act as DC bias voltage inputs) are considered within the scope of the present invention.

It will also be appreciated that the arms 126, 136 in all of the above-described embodiments can be connected to input or output capacitor die without bond wires in, for example, the manner discussed above with reference to FIG. 3A. Thus, while for convenience the electrical connections between the arms 126, 136 and the capacitor die 158, 174 have been shown as being implemented with bond wires in most of the embodiments described above, it will be appreciated that all of the embodiments can be modified so that the arms 126, 136 extend above their associated capacitors 158, 174 and are physically and electrically connected thereto using conductive bumps such as solder bumps or die attach material.

The techniques disclosed herein may be particularly beneficial in higher frequency applications as the inductance required in the matching circuits may be much lower in such applications, and hence the use of traditional bond wires may inject too much inductance. Additionally, the tolerances in the bond wire lengths may have a larger impact at higher frequencies, and in high frequency applications (particularly if lower power) the size of the bond pads may drive the size of the die. In some embodiments, any of the RF transistor amplifier dies disclosed herein may be configured to operate at frequencies greater than 1 GHz. In other embodiments, these RF transistor amplifier dies may be configured to operate at frequencies greater than 2.5 GHz. In still other embodiments, these RF transistor amplifier dies may be configured to operate at frequencies greater than 3.1 GHz. In yet additional embodiments, these RF transistor amplifier dies may be configured to operate at frequencies greater than 5 GHz. In some embodiments, these RF transistor amplifier dies may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or subportions thereof.

Embodiments of the present invention may include RF transistor amplifiers implemented using HEMT Group III nitride-based RF transistor amplifier die. Other embodiments of the present invention may include silicon-based RF transistor amplifiers implemented using laterally diffused metal oxide semiconductor ("LDMOS") transistors.

Embodiments of the present invention may include RF transistor amplifiers having one or more amplification stages, with each stage implemented as a transistor amplifier. In some embodiments, the RF transistor amplifiers may be implemented as a single integrated circuit chip or "die," or may include a plurality of dies. When multiple RF transistor amplifier die are used, they may be connected in series and/or in parallel.

Figure 11A:
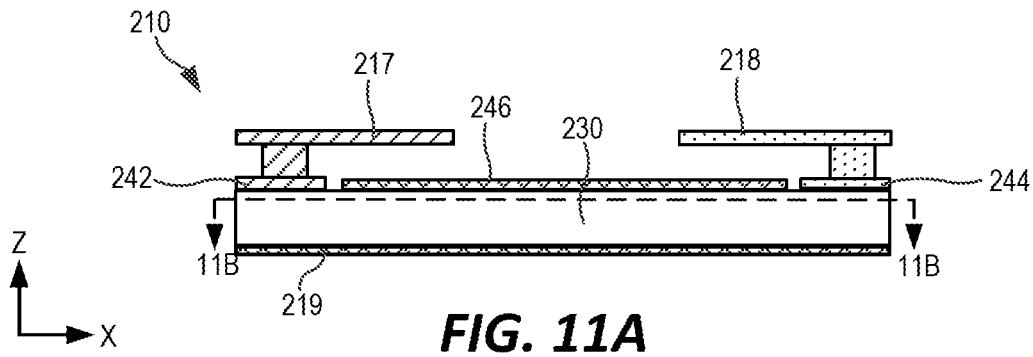
FIG. 11A is a schematic side view of a Group III nitride-based RF transistor amplifier die that may be used to implement the RF transistor amplifiers according to embodiments of the present invention.
Figure 11B:
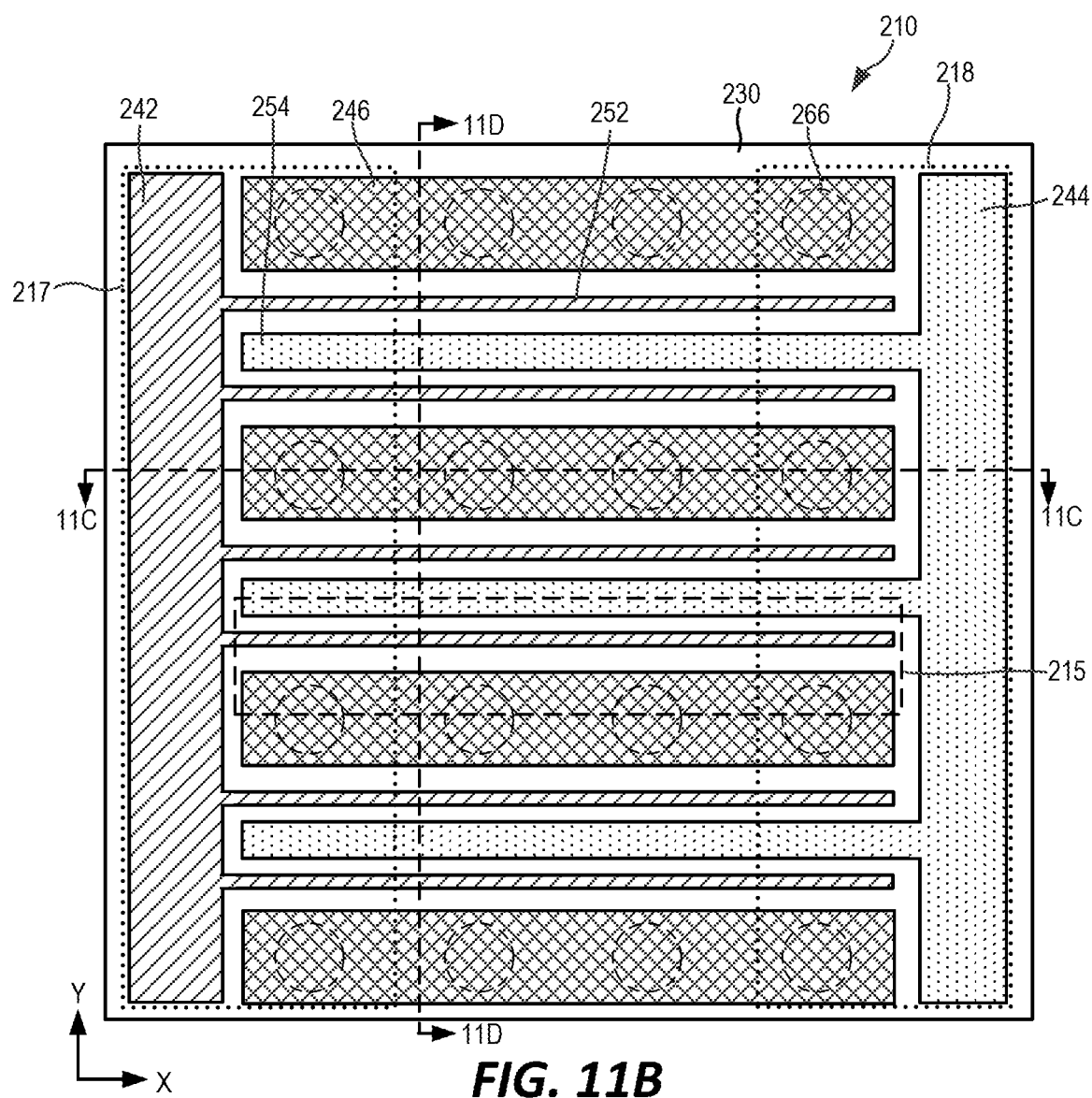
FIG. 11B is a schematic cross-sectional view of an RF transistor amplifier die of FIG. 11A, taken along line 11B-11B of FIG. 11A.
Figure 11C:
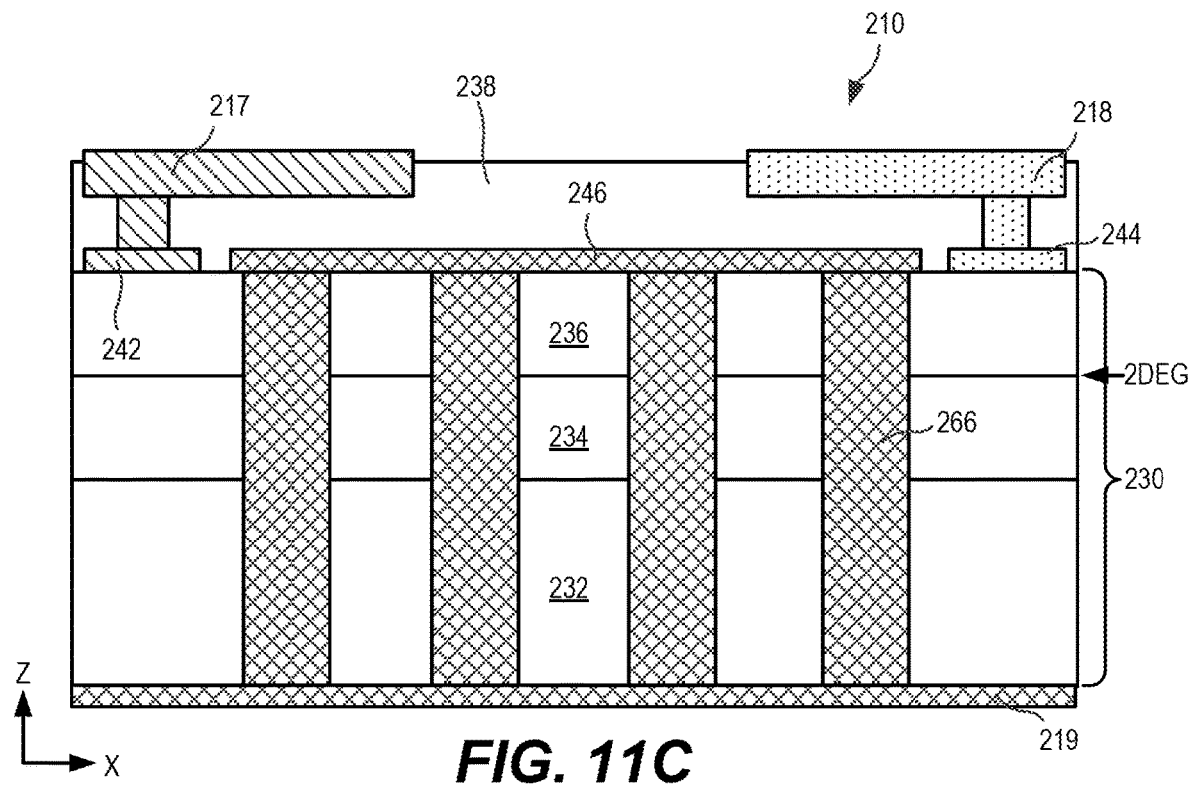
FIG. 11C is a cross-sectional view taken along line 11C-11C of FIG. 11B.
Figure 11D:
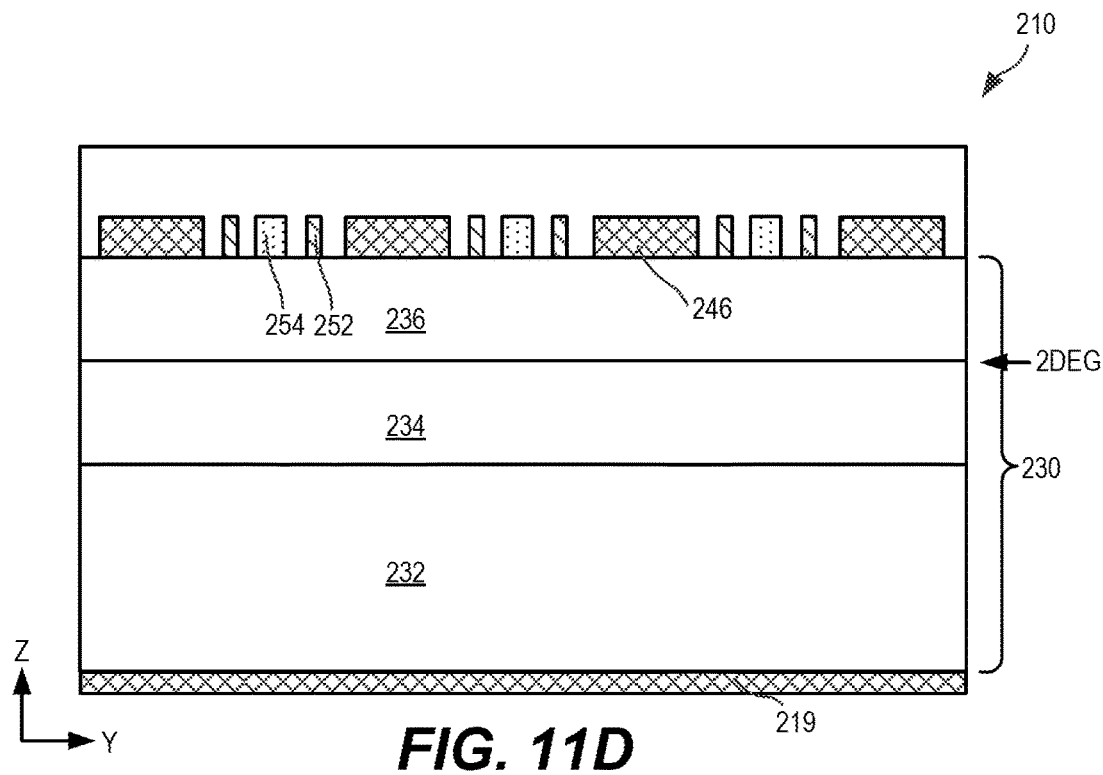
FIG. 11D is a cross-sectional view taken along line 11D-11D of FIG. 11B.

FIGS. 11A-11D depict a Group III nitride-based RF transistor amplifier die 210 that may be used in the RF transistor amplifiers according to certain embodiments of the present invention. In particular, FIG. 11A is a schematic plan view of the Group III nitride-based RF transistor amplifier die 210, and FIG. 11B is a schematic horizontal cross-sectional view of the RF transistor amplifier die 210 that is taken just above a semiconductor layer structure thereof. FIGS. 11C and 11D are schematic cross-sectional views of the RF transistor amplifier die 210 that are taken along lines 11C-11C and 11D-11D of FIG. 11B, respectively.

As shown in FIG. 11A, the Group III nitride-based RF transistor amplifier die 210 includes a gate terminal 217 and a drain terminal 218 that are provided on a top side of the RF transistor amplifier die 210. A source terminal 219 is provided on the back side of the RF transistor amplifier die 210.

The RF transistor amplifier 200 may be a HEMT-based RF transistor amplifier that has a semiconductor layer structure 230. FIG. 11B illustrates the metal patterns that are formed directly on the semiconductor layer structure 230 to form the HEMT devices. As shown in FIG. 11B, these metal patterns includes a gate manifold 242 and a drain manifold 244, a plurality of gate fingers 252, a plurality of drain fingers 254 and a plurality of source fingers 246, all of which may be formed on an upper surface of the semiconductor layer structure 230. The gate manifold 242 and the gate fingers 252 may be implemented as a first monolithic metal pattern, but the present invention is not limited thereto. The gate fingers 252 may be formed of materials that are capable of making a Schottky contact to a Group III nitride-based semiconductor material, such as Ni, Pt, Cu, Pd, Cr, W, and/or WSiN. The drain manifold 244 and drain fingers 254 may be implemented as a second monolithic metal pattern. The drain fingers 254 may include a metal, such as TiAlN, that can form an ohmic contact to Group III nitride-based materials. The source fingers 246 may likewise comprise a metal that can form an ohmic contact to Group III nitride-based materials, and may be electrically connected to the source terminal 219 via a plurality of source vias 266 that extend through the semiconductor layer structure 230.

The RF transistor amplifier die 210 includes a plurality of unit cell transistors 215 that are electrically connected to each other in parallel. As shown, each unit cell transistor 215 includes a gate finger 252, a drain finger 254, and a source finger 246 along with the underlying portion of the semiconductor layer structure 230.

As shown in FIGS. 11C-11D, the semiconductor layer structure 230 includes a plurality of semiconductor layers. The semiconductor layer structure 230 may include at least a channel layer 234 and a barrier layer 236 that is on a top side of the channel layer 234, and may include additional semiconductor and/or non-semiconductor layers. For example, the semiconductor layer structure 230 may include a growth substrate 232 on which the other semiconductor layers are grown. The growth substrate 232 may comprise, for example, a 4H-SiC or 6H-SiC substrate. In other embodiments, the growth substrate 232 may comprise a different semiconductor material (e.g., a Group III nitride-based material, Si, GaAs, ZnO, InP) or a non-semiconductor material (e.g., sapphire). SiC growth substrates 232 may have a much closer crystal lattice match to Group III nitrides than sapphire or silicon, and this closer lattice match may result in Group III nitride films of higher quality than those generally available on sapphire or silicon. SiC also has a very high thermal conductivity, facilitating heat dissipation from the RF amplifier die 210, and the availability of semi-insulating SiC substrates may provide for device isolation and reduced parasitic capacitance.

Optional buffer, nucleation, and/or transition layers (not shown) may be provided on the growth substrate 232 beneath the channel layer 234. For example, an AlN buffer layer may be included to provide an appropriate crystal structure transition between a SiC growth substrate 232 and the remainder of the semiconductor layer structure 230. Additionally, strain balancing transition layer(s) or other layers may also be provided.

The channel layer 234 may be a Group III nitride material, such as $Al_xGa_{1-x}N$ where $0 \leq x<1$, provided that the energy of the conduction band edge of the channel layer 234 is less than the energy of the conduction band edge of the barrier layer 236 at the interface between the channel and barrier layers 234, 236. In certain embodiments, x=0, indicating that the channel layer 234 is gallium nitride ("GaN"). The channel layer 234 may also be other Group III nitrides such as InGaN, AlInGaN or the like. The channel layer 234 may be undoped or unintentionally doped and may be grown to a thickness of, for example, greater than about 2 nm. The channel layer 234 may also be a multi-layer structure, such as a superlattice or combinations of GaN, AlGaN or the like.

The channel layer 234 may have a bandgap that is less than the bandgap of at least a portion of the barrier layer 236, and the channel layer 234 may also have a larger electron affinity than the barrier layer 236. In certain embodiments, the barrier layer 236 is AlN, AlInN, AlGaN or AlInGaN with a thickness of between about 0.1 nm and about 10 nm or more. In particular embodiments, the barrier layer 236 is thick enough and has a high enough Al composition and doping to induce a significant carrier concentration at the interface between the channel layer 234 and the barrier layer 236.

The barrier layer 236 may be a Group III nitride and may have a bandgap larger than that of the channel layer 234 and a smaller electron affinity than the channel layer 234. Accordingly, in certain embodiments of the present invention, the barrier layer 236 may include AlGaN, AlInGaN and/or AlN or combinations of layers thereof. The barrier layer 236 may, for example, be from about 0.1 nm to about 30 nm thick. In certain embodiments, the barrier layer 236 is undoped or doped with an n-type dopant to a concentration less than about $10^{19}$ $cm^{-3}$. In some embodiments of the present invention, the barrier layer 236 is $Al_xGa_{1-x}N$ where $0<x<1$. In particular embodiments, the aluminum concentration is about 25%. However, in other embodiments of the present invention, the barrier layer 236 comprises AlGaN with an aluminum concentration of between about 5% and about 100%.

Due to the difference in bandgap between the barrier layer 236 and the channel layer 234 and piezoelectric effects at the interface between the barrier layer 236 and the channel layer 234, a two dimensional electron gas (2DEG) is induced in the channel layer 234 at a junction between the channel layer 234 and the barrier layer 236. The 2DEG acts as a highly conductive layer that allows conduction between a source region of each unit cell transistor 215 and its associated drain region, where the source region is the portion of the semiconductor layer structure 230 that is directly underneath the source finger 246 and the drain region is the portion of the semiconductor layer structure 230 that is directly underneath the corresponding drain finger 254.

Referring to FIGS. 11A-11D, the gate terminal 217 and the drain terminal 218 may be provided on the upper surface of the RF transistor amplifier die 210. The gate terminal 217 may be physically and electrically connected to the gate manifold 242 (e.g., by conductive pillars), and the drain terminal 218 may be physically and electrically connected to the drain manifold 244 (e.g., by conductive pillars).

It will also be appreciated that the RF transistor amplifier die used in the RF transistor amplifiers according to embodiments of the present invention may have a variety of different configurations from that shown above. For example, while the RF transistor amplifier die illustrated in FIGS. 11A-11D has top side gate and drain terminals and a backside source terminal, it will be appreciated that RF transistor amplifier die having other configurations may be used, including RF transistor amplifier die having backside gate, drain and source terminals as disclosed, for example, in U.S. Provisional Patent Application Ser. No. 63/004,985, filed Apr. 3, 2020, the entire content of which is incorporated herein by reference. Such RF transistor amplifier die with backside gate, drain and source terminals may also have top side gate and drain terminals, which may provide various advantages, such as allowing for more flexible impedance matching circuit implementations. In other embodiments, the RF transistor amplifier die may have top side gate, drain and source terminals as disclosed, for example, in U.S. patent application Ser. No. 16/888,957, filed Jun. 1, 2020, the entire content of which is incorporated by reference herein.

While FIGS. 11A-11D illustrate one example embodiment of a HEMT Group III nitride-based RF transistor amplifier die, it will be appreciated that a wide variety of other RF transistor amplifier die may alternatively be used. For example, in other embodiments, the RF transistor amplifiers may comprise silicon LDMOS based RF transistor amplifiers. In still other embodiments, the RF transistor amplifier may include a MOSFET, a DMOS transistor, and/or a MESFET.

Figure 12:
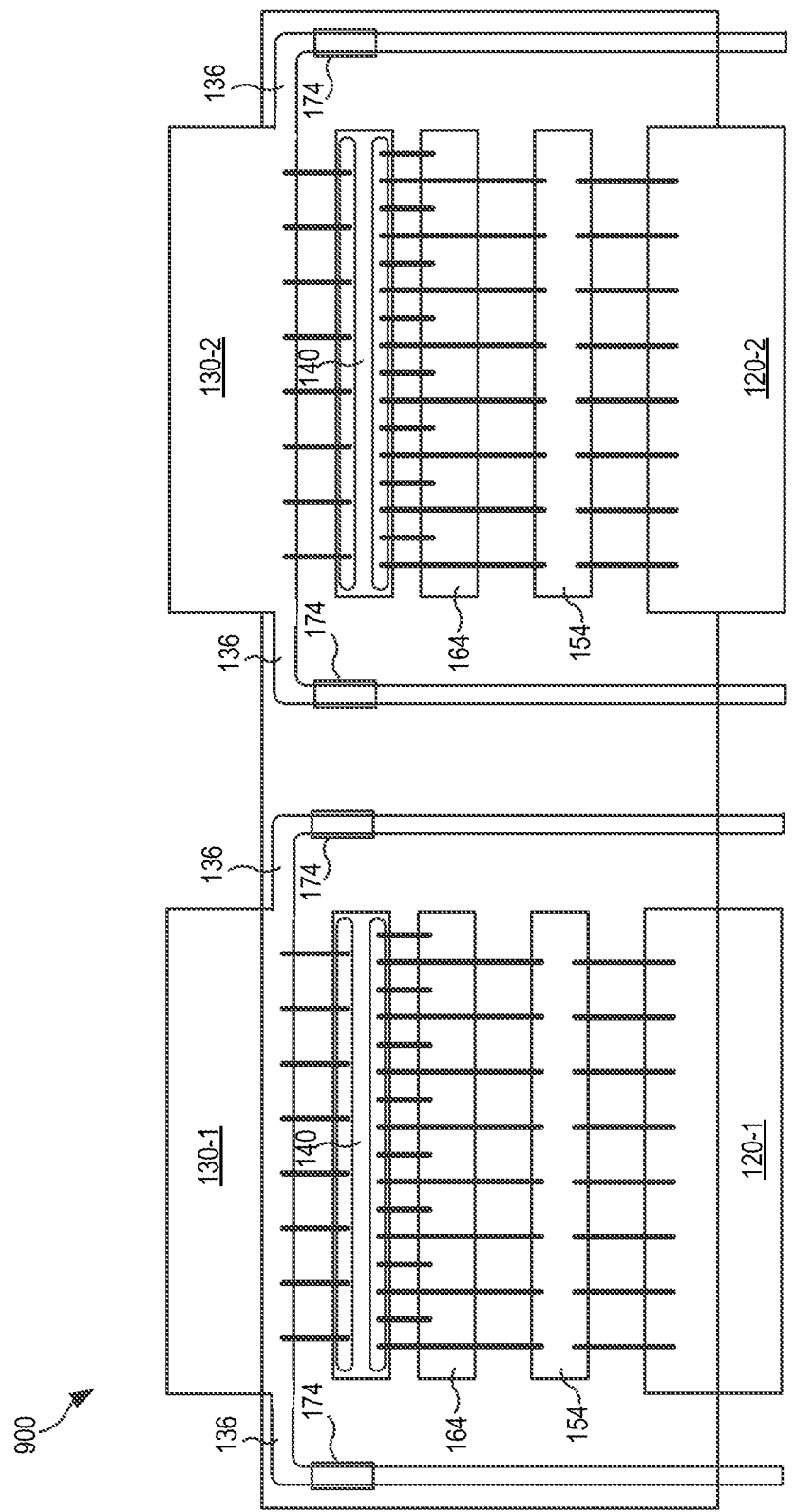
FIG. 12 is a schematic top view of a packaged RF transistor amplifier according to further embodiments of the present invention.

FIG. 12 is a schematic top view of a packaged RF transistor amplifier 900 according to further embodiments of the present invention. The RF transistor amplifier 900 is similar to the RF transistor amplifier 300 of FIG. 4, but with two changes. First, RF transistor amplifier 900 uses conductive bump connections between the arms 136 of the output leadframe 130 and the output impedance matching capacitor die 174 as opposed to the bond wire connections 172 shown in FIG. 4. Second, RF transistor amplifier includes two RF transistor amplifier die 140 and associated circuit elements mounted on a common submount 112. In the embodiment depicted in FIG. 12, each RF transistor amplifier die includes its own input leadframe 120 and output leadframe 130. In other embodiments, a single larger input leadframe 120 and/or output leadframe 130 may be provided that is used for both RF transistor amplifier die and their associated circuit elements.

It will be appreciated that all of the above-described RF transistor amplifiers may be packaged in open-cavity packages such as the package of FIG. 3B or in overmold packages such as the package of FIG. 3C. Individual drawings of each RF transistor amplifiers are not provided for simplicity. The open-cavity package may be a ceramic package or a plastic package.

Figure 13A:
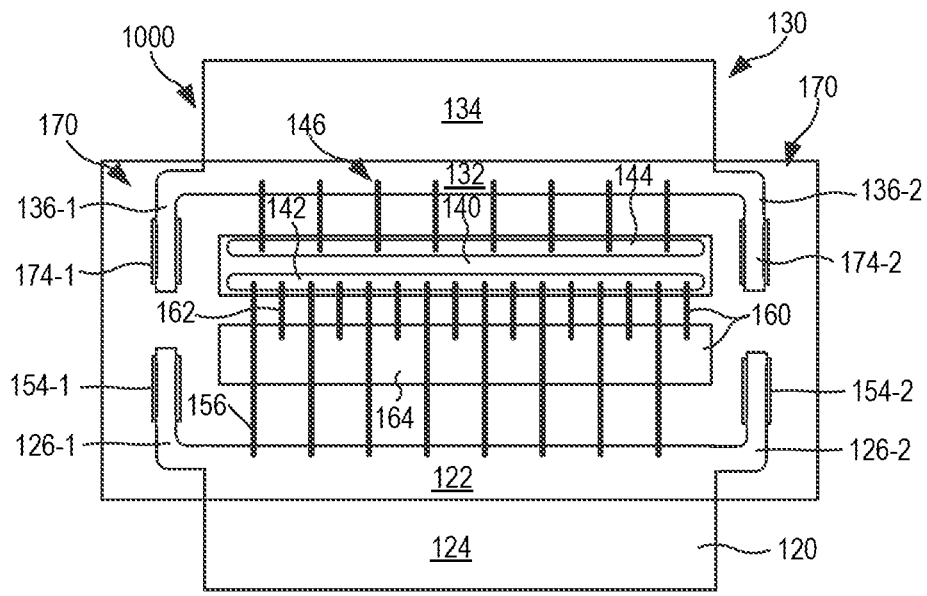
FIGS. 13A and 13B are a plan view and a circuit diagram, respectively, of an RF transistor amplifier according to further embodiments of the present invention.
Figure 13B:
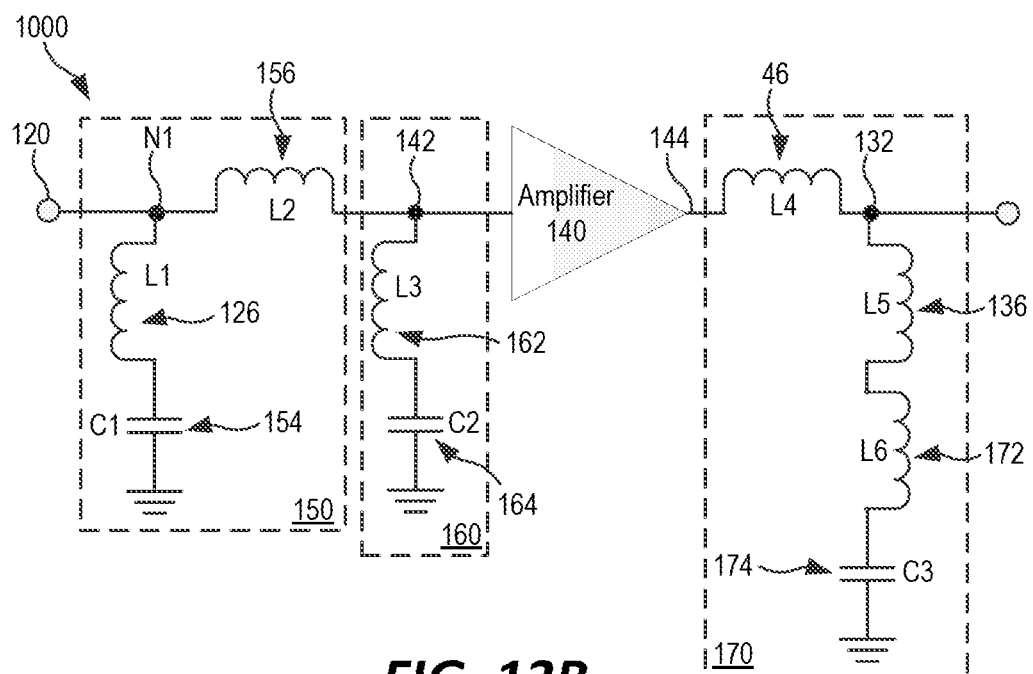

It will also be appreciated that the RF transistor amplifiers according to embodiments of the present invention may have different impedance matching and/or harmonic termination circuit designs. By way of example, FIGS. 13A and 13B are a plan view and a circuit diagram, respectively, of an RF transistor amplifier 1000 according to further embodiments of the present invention that has a slightly different input impedance matching circuit design. FIGS. 13A and 13B illustrate slightly different designs for the input and output matching circuits. In particular, in the RF transistor amplifier 1000, a pair of input impedance matching capacitors 154-1, 154-2 are provided that are connected by arms 126-1, 126-2, respectively, of the input leadframe 120 to the input pad 122. The arms 154 have an associated inductance L1 and the capacitor die 154 provide an associated capacitance C1, as shown in FIG. 13B. It will be appreciated that a wide variety of additional changes may be made that use the arms 126, 136 to connect capacitors to the input and/or output of the RF transistor amplifier die 140.

Embodiments of the present inventive concepts have been described above with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A packaged radio frequency ("RF") transistor amplifier, comprising:
a package housing;
an RF transistor amplifier die that is mounted within the package housing;
a first capacitor die that is mounted within the package housing;
an input leadframe that extends through the package housing to electrically connect to a gate terminal of the RF transistor amplifier die;
an output leadframe that extends through the package housing to electrically connect to a drain terminal of the RF transistor amplifier die, the output leadframe including an output pad region, an output lead that extends outside of the package housing, and a first arm that extends from one of the output pad region and the output lead to be adjacent the first capacitor die.

2. The packaged RF transistor amplifier of claim 1, wherein the first capacitor die is a first output impedance matching capacitor die, and wherein the first arm is electrically interposed between a drain terminal of the RF transistor amplifier die to and a first output impedance matching capacitor of the first output impedance matching capacitor die.

3. The packaged RF transistor amplifier of claim 1, wherein a width of the first arm is less than half a width of the output pad region.

4. The packaged RF transistor amplifier of claim 1, wherein the output leadframe further comprises a second arm that extends from one of the output pad region and the output lead to be adjacent a second output impedance matching capacitor die.

5. The packaged RF transistor amplifier of claim 1, wherein a distal end of the first arm is outside the package housing.

6. The packaged RF transistor amplifier of claim 5, wherein the distal end of the first arm is configured to be connected to a direct current voltage source.

7. The packaged RF transistor amplifier of claim 1, wherein the input leadframe includes an input pad region, an input lead, and a third arm that extends from the input pad region to outside the package housing to provide a direct current voltage source input.

8. The packaged RF transistor amplifier of claim 7, wherein the input leadframe further comprises a fourth arm that extends from the input pad region.

9. The packaged RF transistor amplifier of claim 2, wherein the first output impedance matching capacitor die is connected to the first arm by a first conductive bump.

10. The packaged RF transistor amplifier of claim 5, wherein the output lead extends through a first wall of the package housing, and the first arm extends through a second wall of the package housing that is different from the first wall.

11. The packaged RF transistor amplifier of claim 10, wherein the second wall is generally perpendicular to the first wall.

12. The packaged RF transistor amplifier of claim 1, wherein the RF transistor amplifier die is configured to operate in at least a portion of one or more of the 2.5-2.7 GHz, 3.4-4.2 GHz, or 5.1-5.8 GHz frequency bands.

13. The packaged RF transistor amplifier of claim 1, wherein the RF transistor amplifier die is configured to operate at frequencies above 10 GHz.

14. A packaged radio frequency ("RF") transistor amplifier, comprising:
a package housing;
an RF transistor amplifier die that is mounted within the package housing;
an input leadframe that includes an input lead that extends through the package housing to electrically connect to a gate terminal of the RF transistor amplifier die;
a monolithic output leadframe that includes an output lead, a direct current lead and an electrical connection between the output lead and the direct current lead,
wherein the output lead extends through a first portion of the package housing to electrically connect to a drain terminal of the RF transistor amplifier die, and the direct current lead extends through a second portion of the package housing that is spaced apart from the first portion of the package housing.

15. The packaged RF transistor amplifier of claim 14, wherein the output leadframe further includes an output pad region, and wherein the direct current lead comprises an arm that extends from the output pad region.

16. The packaged RF transistor amplifier of claim 15, further comprising a first capacitor die, wherein a portion of the first arm is adjacent the first capacitor die.

17. The packaged RF transistor amplifier of claim 16, wherein the first capacitor die is a first output impedance matching capacitor die, and wherein the first arm is part of an electrical path connecting a drain terminal of the RF transistor amplifier die to the first output impedance matching capacitor die.

18. The packaged RF transistor amplifier of claim 14, wherein the output lead extends through a first wall of the package housing, and the direct current lead extends through a second wall of the package housing.

19. The packaged RF transistor amplifier of claim 14, wherein the input leadframe is a monolithic input leadframe that includes the input lead a second direct current lead and an electrical connection between the input lead and the second direct current lead, and wherein the input lead and the second direct current lead extend through spaced apart portions of the package housing.

20. The packaged RF transistor amplifier of claim 14, wherein the output lead extends through a first wall of the package housing, and the direct current lead extends through a second wall of the package housing.

21. The packaged RF transistor amplifier of claim 18, wherein the second wall is generally perpendicular to the first wall.

22. The packaged RF transistor amplifier of claim 14, wherein the RF transistor amplifier die is configured to operate in at least a portion of one or more of the 2.5-2.7 GHz, 3.4-4.2 GHz, or 5.1-5.8 GHz frequency bands.

23. A packaged radio frequency ("RF") transistor amplifier, comprising:
a package housing;
an RF transistor amplifier die that is mounted within the package housing,
a first output impedance matching capacitor die that is mounted within the package housing;
an input leadframe that electrically connects to a gate terminal of the RF transistor amplifier die; and
an output leadframe that includes an output lead that extends through the package housing to electrically connect to a drain terminal of the RF transistor amplifier die,
wherein the output leadframe is mounted on the first output impedance matching capacitor die and electrically connected to the first output impedance matching capacitor die via a first conductive bump, and
wherein the output leadframe is a monolithic structure that further comprises an output pad region and a first arm, and wherein the first arm is directly connected to the first output impedance matching capacitor die via the first conductive bump.

24. The packaged RF transistor amplifier of claim 23, wherein the output leadframe further comprises a second arm that is directly connected to a second output impedance matching capacitor die by a second conductive bump.

25. The packaged RF transistor amplifier of claim 23, wherein a distal end of the first arm is outside the package housing.

26. The packaged RF transistor amplifier of claim 23, wherein the input leadframe is a monolithic structure that includes an input pad region, the input lead, and a third arm that extends from the input pad region to outside the package housing.

27. The packaged RF transistor amplifier of claim 1, wherein the first arm and the first capacitor die are coupled in series between the output pad region or the output lead and electrical ground.

28. The packaged RF transistor amplifier of claim 16, wherein the first arm and the first capacitor die are coupled in series between the output pad region or the output lead and electrical ground.

29. The packaged RF transistor amplifier of claim 23, wherein the first arm and the first capacitor die are coupled in series between the output pad region or the output lead and electrical ground.

30. The packaged RF transistor amplifier of claim 23, wherein the RF transistor amplifier die is configured to operate in at least a portion of one or more of the 2.5-2.7 GHz, 3.4-4.2 GHz, or 5.1-5.8 GHz frequency bands.

* * * * *

UNITED STATES PATENT AND TRADEMARK OFFICE
CERTIFICATE OF CORRECTION

PATENT NO. : 11,588,448 B2
APPLICATION NO. : 16/910900
DATED : February 21, 2023
INVENTOR(S) : Chidurala et al.

It is certified that error appears in the above-identified patent and that said Letters Patent is hereby corrected as shown below:

In the Claims

Column 22, Line 43, Claim 2: Please correct "die to and" to read --die and--

Signed and Sealed this
Thirtieth Day of May, 2023

Katherine Kelly Vidal
*Director of the United States Patent and Trademark Office*